(12) United States Patent
Ouchi

(10) Patent No.: US 12,542,528 B2
(45) Date of Patent: Feb. 3, 2026

(54) ACOUSTIC WAVE DEVICE

(71) Applicant: Murata Manufacturing Co., Ltd., Nagaokakyo (JP)

(72) Inventor: Minefumi Ouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 313 days.

(21) Appl. No.: 18/206,642

(22) Filed: Jun. 7, 2023

(65) Prior Publication Data

US 2023/0318563 A1 Oct. 5, 2023

Related U.S. Application Data

(63) Continuation of application No. PCT/JP2021/044930, filed on Dec. 7, 2021.

(60) Provisional application No. 63/127,301, filed on Dec. 18, 2020.

(51) Int. Cl.
*H03H 9/02* (2006.01)
*H03H 9/13* (2006.01)
*H03H 9/17* (2006.01)

(52) U.S. Cl.
CPC ........ *H03H 9/02228* (2013.01); *H03H 9/132* (2013.01); *H03H 9/173* (2013.01)

(58) Field of Classification Search
CPC .................................................. H03H 9/02228
USPC .............. 333/187; 310/313 B, 349, 365, 366
See application file for complete search history.

(56) References Cited

U.S. PATENT DOCUMENTS

| 6,445,265 | B1 | 9/2002 | Wright |
| 10,491,192 | B1 | 11/2019 | Plesski et al. |
| 2008/0106354 | A1 | 5/2008 | Kando |
| 2014/0145556 | A1 | 5/2014 | Kadota |

(Continued)

FOREIGN PATENT DOCUMENTS

| JP | 2002534886 A | 10/2002 |
| JP | 2005217818 A | 8/2005 |

(Continued)

OTHER PUBLICATIONS

International Search Report in PCT/JP2021/044930, mailed Feb. 22, 2022, 3 pages.

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a support, a piezoelectric layer including a first principal surface adjacent to the support and a second principal surface, a first IDT electrode on the first principal surface and including first and second electrode fingers, and a second IDT electrode on the second principal surface not overlapping the first IDT electrode in plan view and including first and second electrode fingers. When d is a thickness of piezoelectric layer and p is a center-to-center distance between adjacent ones of the electrode fingers, d/p is about 0.5 or less in the first and second IDT electrodes. An insulating film is provided on the second principal surface overlapping the first IDT electrode in plan view, and a wiring electrode extending along the insulating film overlapping the first IDT electrode in plan view, the wiring electrode being connected to the second IDT electrode.

20 Claims, 20 Drawing Sheets

(56) References Cited

U.S. PATENT DOCUMENTS

2017/0214385 A1\* 7/2017 Bhattacharjee ...... H03H 3/0072
2017/0353173 A1   12/2017 Sakurai et al.
2019/0273478 A1\* 9/2019 Lin ....................... H03H 9/587

FOREIGN PATENT DOCUMENTS

| JP | 2017220778 A | 12/2017 |
| WO | 2007007462 A1 | 1/2007 |
| WO | 2013021948 A1 | 2/2013 |

OTHER PUBLICATIONS

Written Opinion in PCT/JP2021/044930, mailed Feb. 22, 2022, 3 pages.

\* cited by examiner

ACOUSTIC WAVE DEVICE

CROSS REFERENCE TO RELATED APPLICATIONS

This application claims the benefit of priority to Provisional Application No. 63/127,301 filed on Dec. 18, 2020 and is a Continuation Application of PCT Application No. PCT/JP2021/044930 filed on Dec. 7, 2021. The entire contents of each application are hereby incorporated herein by reference.

BACKGROUND OF THE INVENTION

1. Field of the Invention

The present invention relates to an acoustic wave device.

2. Description of the Related Art

Acoustic wave devices are widely used as, for example, a filter of a cellular phone. In recent years, an acoustic wave device that uses bulk waves in a thickness-shear mode as described in U.S. Pat. No. 10,491,192 has been proposed. This acoustic wave device includes electrodes forming a pair on a piezoelectric layer. The electrodes forming a pair face each other on the piezoelectric layer, and are connected to different potentials. An alternating-current voltage is applied between the electrodes to excite bulk waves in a thickness-shear mode.

SUMMARY OF THE INVENTION

Unfortunately, an acoustic wave resonator that uses bulk waves in a thickness-shear mode tends to have a large pitch between the electrodes, and it is difficult to reduce the size of the acoustic wave resonator.

Preferred embodiments of the present invention provide acoustic wave devices each having a reduced size.

An acoustic wave device according to a preferred embodiment of the present invention includes a support including a support substrate, a piezoelectric layer provided on the support and including a first principal surface adjacent to the support member and a second principal surface opposite to the first principal surface, a first IDT electrode provided on the first principal surface and including a plurality of electrode fingers, and a second IDT electrode provided on the second principal surface in a region that does not overlap the first IDT electrode in plan view, the second IDT electrode including a plurality of electrode fingers. When d is a thickness of the piezoelectric layer and p is a center-to-center distance between adjacent ones of the electrode fingers, d/p is about 0.5 or less in the first IDT electrode and the second IDT electrode. The acoustic wave device further includes an insulating film provided on the second principal surface in a region overlapping the first IDT electrode in plan view, and a wiring electrode extending along the insulating film in a region overlapping the first IDT electrode in plan view, the wiring electrode being connected to the second IDT electrode.

According to the acoustic wave devices of preferred embodiments of the present invention, the size of the acoustic wave devices can be reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 8A to 8E are graphs showing the results obtained by using the first model when the insulating film has a thickness of 1 μm and $1/Q=0$, wherein FIG. 8A shows the impedance frequency characteristics obtained when the material of the insulating film is polyethylene and the Young's modulus is about 0.91 GPa, FIG. 8B shows the impedance frequency characteristics obtained when the material of the insulating film is polystyrene and the Young's modulus is about 1.39 GPa, FIG. 8C shows the impedance frequency characteristics obtained when the material of the insulating film is polycarbonate and the Young's modulus is about 2.24 GPa, FIG. 8D shows the impedance frequency characteristics obtained when the material of the insulating film is polyethylene terephthalate and the Young's modulus is about 3.44 GPa, and FIG. 8E shows the impedance frequency characteristics obtained when the material of the insulating film is polyacetal and the Young's modulus is about 3.58 GPa.

FIGS. 9A to 9E are graphs showing the results obtained by using the first model when the material of the insulating film is polyethylene and $1/Q=0$, wherein FIG. 9A shows the impedance frequency characteristics obtained when the insulating film has a thickness of about 0.5 μm, FIG. 9B shows the impedance frequency characteristics obtained when the insulating film a thickness of 1 μm, FIG. 9C shows the impedance frequency characteristics obtained when the insulating film has a thickness of about 1.5 μm, FIG. 9D shows the impedance frequency characteristics obtained when the insulating film has a thickness of about 2 μm, and FIG. 9E shows the impedance frequency characteristics obtained when the insulating film has a thickness of about 3 μm.

FIGS. 10A to 10E are graphs showing the results obtained by using the first model when the material of the insulating film is polyethylene and Q=50, wherein FIG. 10A shows the impedance frequency characteristics obtained when the insulating film has a thickness of about 0.5 μm, FIG. 10B shows the impedance frequency characteristics obtained when the insulating film has a thickness of about 1 μm, FIG. 10C shows the impedance frequency characteristics obtained when the insulating film has a thickness of about 1.5 μm, FIG. 10D shows the impedance frequency characteristics obtained when the insulating film has a thickness of about 2 μm, and FIG. 10E shows the impedance frequency characteristics obtained when the insulating film has a thickness of about 3 μm.

FIGS. 11A to 11E are graphs showing the results obtained by using the second model when the material of the insulating film is polyethylene and 1/Q=0, wherein FIG. 11A shows the impedance frequency characteristics obtained when the insulating film has a thickness of about 0.5 μm, FIG. 11B shows the impedance frequency characteristics obtained when the insulating film has a thickness of about 1 μm, FIG. 11C shows the impedance frequency characteristics obtained when the insulating film has a thickness of about 1.5 μm, FIG. 11D shows the impedance frequency characteristics obtained when the insulating film has a thickness of about 2 μm, and FIG. 11E shows the impedance frequency characteristics obtained when the insulating film has a thickness of about 3 μm.

FIGS. 12A to 12E are graphs showing the results obtained by using the second model when the material of the insulating film is polyethylene and Q=50, wherein FIG. 12A shows the impedance frequency characteristics obtained when the insulating film has a thickness of about 0.5 μm, FIG. 12B shows the impedance frequency characteristics obtained when the insulating film has a thickness of about 1 μm, FIG. 12C shows the impedance frequency characteristics obtained when the insulating film has a thickness of about 1.5 μm, FIG. 12D shows the impedance frequency characteristics obtained when the insulating film has a thickness of about 2 μm, and FIG. 12E shows the impedance frequency characteristics obtained when the insulating film has a thickness of about 3 μm.

FIGS. 13A to 13E are graphs showing the results obtained by using the second model when the insulating film has a thickness of about 2 μm and Q=1000, wherein FIG. 13A shows the impedance frequency characteristics obtained when the insulating film has a Young's modulus of about 1 GPa, FIG. 13B shows the impedance frequency characteristics obtained when the insulating film has a Young's modulus of about 5 GPa, FIG. 13C shows the impedance frequency characteristics obtained when the insulating film has a Young's modulus of about 10 GPa, FIG. 13D shows the impedance frequency characteristics obtained when the insulating film has a Young's modulus of about 15 GPa, and FIG. 13E shows the impedance frequency characteristics obtained when the insulating film has a Young's modulus of about 20 GPa.

DETAILED DESCRIPTION OF THE PREFERRED EMBODIMENTS

Preferred embodiments of the present invention will be described with reference to the drawings to clarify the present invention.

It is to be noted that preferred embodiments described in this specification are illustrative and that it is possible to partially replace or combine the structures in different preferred embodiments.

Figure 1:
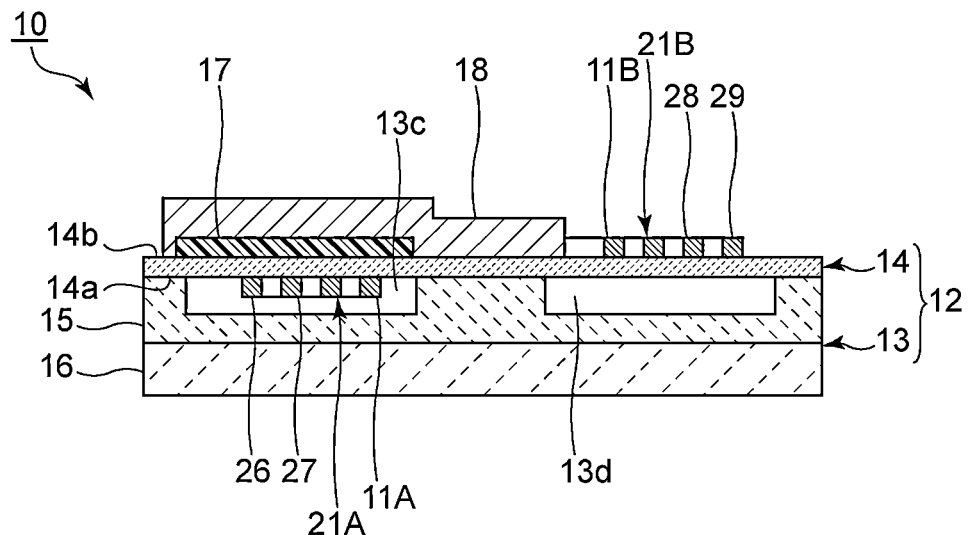
FIG. 1 is a schematic elevational cross-sectional view of an acoustic wave device according to a first preferred embodiment of the present invention.
Figure 2:
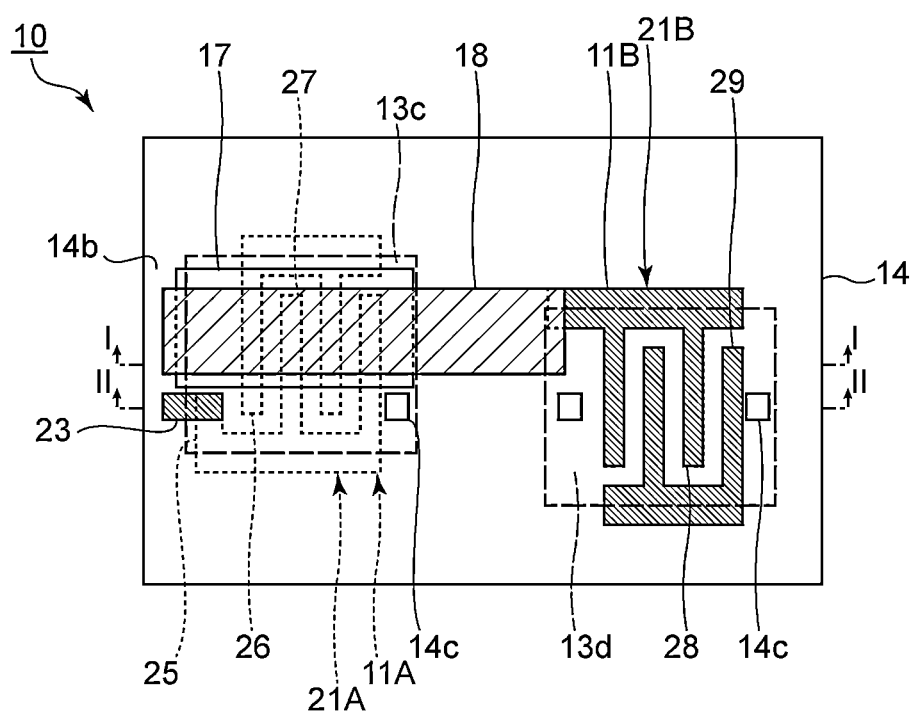
FIG. 2 is a schematic plan view of the acoustic wave device according to the first preferred embodiment of the present invention.

FIG. 1 is a schematic elevational cross-sectional view of an acoustic wave device according to a first preferred embodiment of the present invention. FIG. 2 is a schematic plan view of the acoustic wave device according to the first preferred embodiment. FIG. 1 is a schematic cross-sectional view taken along line I-I in FIG. 2. In FIG. 2, an electrode positioned at the near side is shown as a hatched region. This also applies to other schematic plan views.

As illustrated in FIG. 1, an acoustic wave device 10 includes a piezoelectric substrate 12, a first IDT electrode 11A, and a second IDT electrode 11B. The piezoelectric substrate 12 includes a support member 13 and a piezoelectric layer 14. In the present preferred embodiment, the support member 13 includes a support substrate 16 and an intermediate layer 15. The intermediate layer 15 is provided on the support substrate 16. The piezoelectric layer 14 is provided on the intermediate layer 15. The support member 13 may be formed only of the support substrate 16.

The support member 13 includes a first cavity 13c and a second cavity 13d. More specifically, the intermediate layer 15 has a first recess and a second recess. The piezoelectric layer 14 is provided on the intermediate layer 15 to cover the first recess and the second recess. The first recess is surrounded by the intermediate layer 15 and the piezoelectric layer 14. Thus, the first cavity 13c is formed. Similarly, the second recess is surrounded by the intermediate layer 15 and the piezoelectric layer 14. Thus, the second cavity 13d is formed. The first cavity 13c and the second cavity 13d may be formed as an integral cavity.

The intermediate layer 15 may be made of an appropriate dielectric, such as silicon oxide or tantalum pentoxide. The support substrate 16 may be made of, for example, a semiconductor, such as silicon, or an appropriate ceramic. It is not necessary that the support member 13 include the intermediate layer 15. When the intermediate layer 15 is not included, the support substrate 16 may include the first recess and the second recess.

The piezoelectric layer 14 includes a first principal surface 14a and a second principal surface 14b. The first principal surface 14a and the second principal surface 14b are opposite to each other. Among the first principal surface 14a and the second principal surface 14b, the first principal surface 14a is a principal surface facing the support member 13. In the present preferred embodiment, the piezoelectric layer 14 is a lithium niobate layer. More specifically, the piezoelectric layer 14 is a $LiNbO_3$ layer. The piezoelectric layer 14 may be, for example, a lithium tantalate layer, such as a $LiTaO_3$ layer.

The first IDT electrode 11A is provided on the first principal surface 14a of the piezoelectric layer 14. The first IDT electrode 11A is disposed in the first cavity 13c. The second IDT electrode 11B is provided on the second principal surface 14b. The second IDT electrode 11B overlaps the second cavity 13d in plan view. More specifically, the second IDT electrode 11B is provided on the second principal surface 14b in a region that does not overlap the first IDT electrode 11A in plan view. In this specification, plan view is viewed a direction from a location corresponding to the top of FIG. 1.

The first IDT electrode 11A is provided on the first principal surface 14a of the piezoelectric layer 14 included in the piezoelectric substrate 12, so that an acoustic wave resonator 21A is provided. Similarly, the second IDT electrode 11B is provided on the second principal surface 14b of the piezoelectric layer 14, so that an acoustic wave resonator 21B is provided. Thus, the acoustic wave device 10 according to the present preferred embodiment includes two acoustic wave resonators. The acoustic wave device 10 may be, for example, a portion of a filter device. A acoustic wave device according to a preferred embodiment of the present invention may be a filter device including three or more acoustic wave resonators, or a composite filter device, such as a duplexer or a multiplexer.

Each of the acoustic wave resonators included in the acoustic wave device 10 is capable of using bulk waves in a thickness-shear mode, such as a first thickness-shear mode. More specifically, the first IDT electrode 11A includes a plurality of first electrode fingers 26 and a plurality of second electrode fingers 27. As illustrated in FIG. 2, the first electrode fingers 26 and the second electrode fingers 27 interdigitate with each other. Similarly, the second IDT electrode 11B includes a plurality of first electrode fingers 28 and a plurality of second electrode fingers 29. Each of the first IDT electrode 11A and the second IDT electrode 11B may be defined by a single-layer metal film or a multilayer metal film. In the following description, the first electrode fingers and the second electrode fingers are sometimes generically referred to as electrode fingers.

In each of the first IDT electrode 11A and the second IDT electrode 11B, when d is a thickness of the piezoelectric layer 14 and p is a center-to-center distance between adjacent ones of the electrode fingers, d/p is about 0.5 or less. Accordingly, bulk waves in a thickness-shear mode are appropriately excited in each acoustic wave resonator. The structures of the IDT electrodes according to various preferred embodiments of the present invention will be described in detail below.

Figure 3:
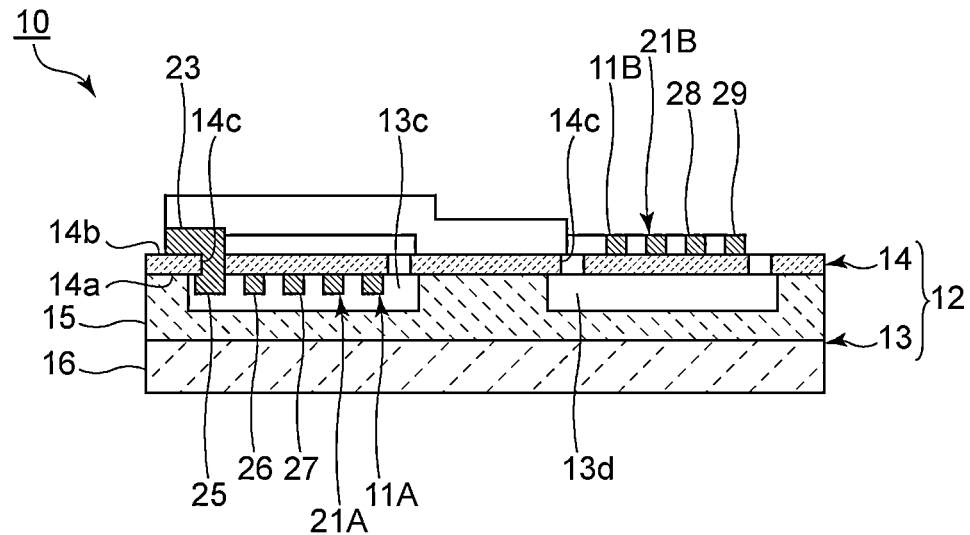
FIG. 3 is a schematic cross-sectional view taken along line II-II in FIG. 2.

FIG. 3 is a schematic cross-sectional view taken along line II-II in FIG. 2.

An extended wiring line 25 is provided on the first principal surface 14a of the piezoelectric layer 14. The extended wiring line 25 is connected to the first IDT electrode 11A. The piezoelectric layer 14 includes a plurality of through holes 14c. One of the through holes 14c extends to the extended wiring line 25. A connection electrode 23 extends through this through hole 14c and along the first principal surface 14a. One end of the connection electrode 23 is connected to the extended wiring line 25. The first IDT electrode 11A may, for example, be connected to another element by a wiring line provided on the second principal surface 14b. Thus, it is not necessary that the first IDT electrode 11A be connected to the connection electrode 23 provided on the first principal surface 14a.

Referring to FIG. 1 again, an insulating film 17 is provided on the second principal surface 14b of the piezoelectric layer 14. The insulating film 17 is, for example, a resin film. The insulating film 17 overlaps the first IDT electrode 11A in plan view. A wiring electrode 18 is provided on the second principal surface 14b such that the wiring electrode 18 extends along the insulating film 17. The wiring electrode 18 is connected to the second IDT electrode 11B.

One of the unique features of the present preferred embodiment is that, in plan view, the wiring electrode 18 extends along the insulating film 17 in a region overlapping the first IDT electrode 11A and is connected to the second IDT electrode 11B. Accordingly, the size of the acoustic wave device 10 can be reduced. This will be described below with reference to a first reference example and a second reference example.

Figure 4:
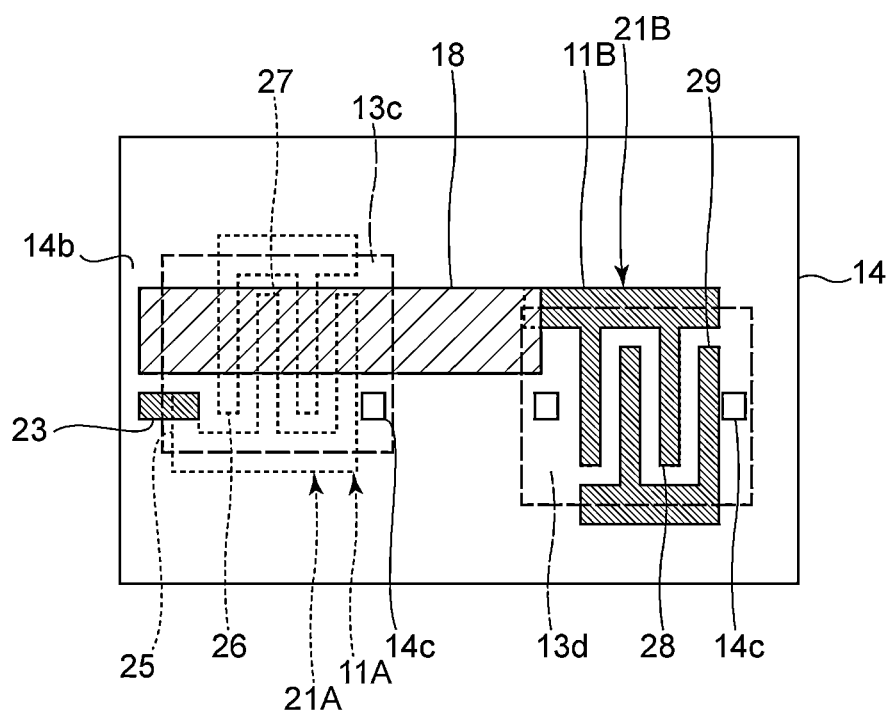
FIG. 4 is a schematic plan view of an acoustic wave device according to a first reference example.

In the first reference example illustrated in FIG. 4, the insulating film 17 is not provided. Therefore, the entirety of the wiring electrode 18 is provided directly on the second principal surface 14b of the piezoelectric layer 14. In plan view, the wiring electrode 18 overlaps the first IDT electrode 11A. In this case, the electrical characteristics of the acoustic wave device are significantly degraded.

Figure 5:
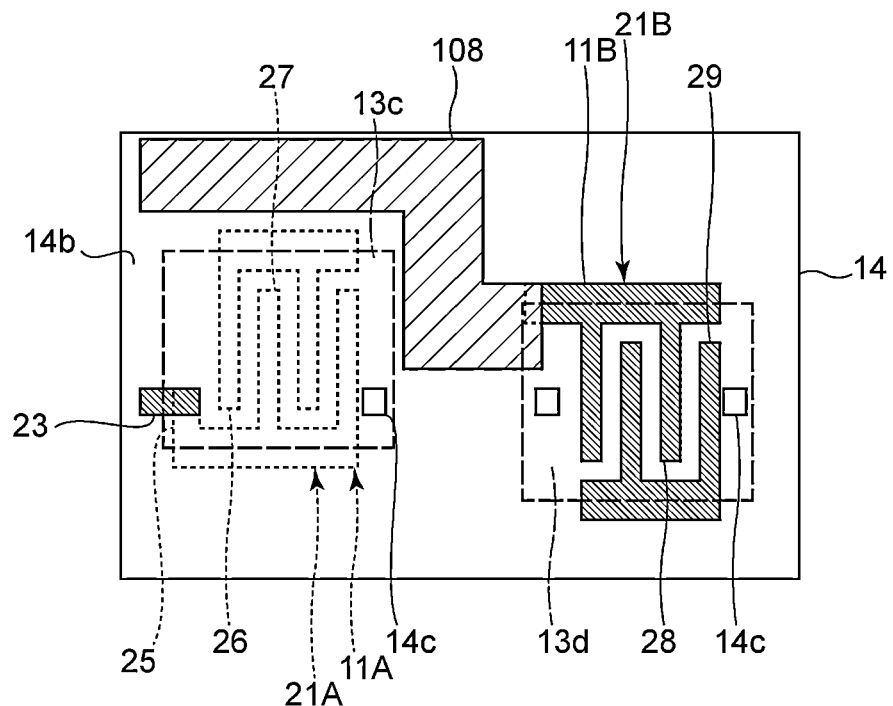
FIG. 5 is a schematic plan view of an acoustic wave device according to a second reference example.

In the second reference example illustrated in FIG. 5, the insulating film 17 is not provided, and a wiring electrode 108 does not overlap the first IDT electrode 11A in plan view. The wiring electrode 108 extends around the region in which the first IDT electrode 11A is provided, and therefore the size of the acoustic wave device is increased.

In contrast, in the present preferred embodiment illustrated in FIG. 2, the wiring electrode 18 extends along the insulating film 17 in the region overlapping the first IDT electrode 11A and is connected to the second IDT electrode 11B. Therefore, the electrical characteristics of the acoustic wave device 10 are not significantly degraded even when the wiring electrode 18 does not extend around the region in which the first IDT electrode 11A is provided. Therefore, the area of the region in which the wiring electrode 18 extends can be reduced without causing significant degradation of the electrical characteristics of the acoustic wave device 10, and the size of the acoustic wave device 10 can be reduced.

Resins suitable for the insulating film 17 are studied. Table 1 provided below shows examples of resins and physical properties of the resins.

TABLE 1

| Material Name | Density [kg/m3] | Young's Modulus [Pa] | Poisson's Ratio | tan δ | Relative Dielectric Constant |
|---|---|---|---|---|---|
| Polyethylene (PE) | $0.957 \times 10^3$ | $0.91 \times 10^9$ | 0.41 | $3 \times 10^{-4}$ | 2.2 |
| Polystyrene (PS) | $1.052 \times 10^3$ | $1.39 \times 10^9$ | 0.35 | $5 \times 10^{-4}$ | 2.55 |
| Polycarbonate (PC) | $1.2 \times 10^3$ | $2.24 \times 10^9$ | 0.3 | $15 \times 10^{-4}$ | 2.99 |
| Polyethylene Terephthalate (PET) | $1.36 \times 10^3$ | $3.44 \times 10^9$ | 0.3 | $50 \times 10^{-4}$ | 3.2 |
| Polyacetal (POM) | $1.42 \times 10^3$ | $3.58 \times 10^9$ | 0.3 | $48 \times 10^{-4}$ | 3.7 |
| Polyurethane | $1.15 \times 10^3$ | $1.26 \times 10^9$ | 0.3 | $750 \times 10^{-4}$ | 4.65 |
| Glass Epoxy | $1.8 \times 10^3$ | $21 \times 10^9$ | 0.3 | $100 \times 10^{-4}$ | 4.25 |
| ABS Resin | $1.03 \times 10^3$ | $1.89 \times 10^9$ | 0.3 | $110 \times 10^{-4}$ | 3.1 |
| Nylon 12 | $1.146 \times 10^3$ | $1.25 \times 10^9$ | 0.3 | $160 \times 10^{-4}$ | 3.7 |

Simulations were performed to obtain the relationship between parameters of the resin used to form the insulating film 17 and the impedance frequency characteristics of the acoustic wave resonator 21A including the first IDT electrode 11A. A first model and a second model were used as models for the simulations.

Figure 6:
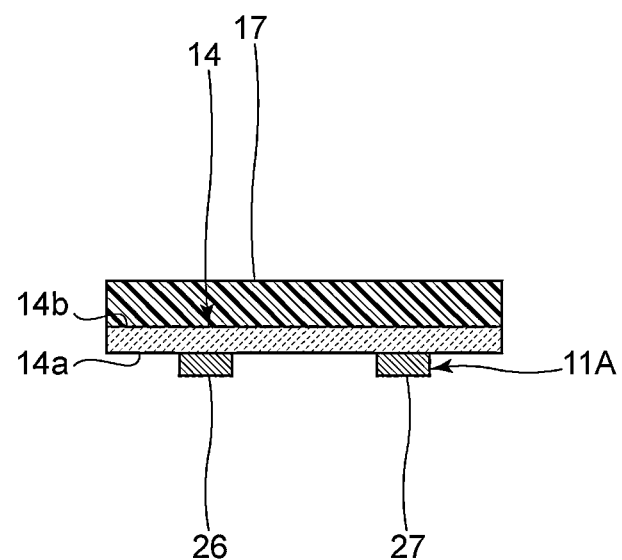
FIG. 6 illustrates a first model used in simulations of relationships between parameters of an insulating film and resonance characteristics.
Figure 7:
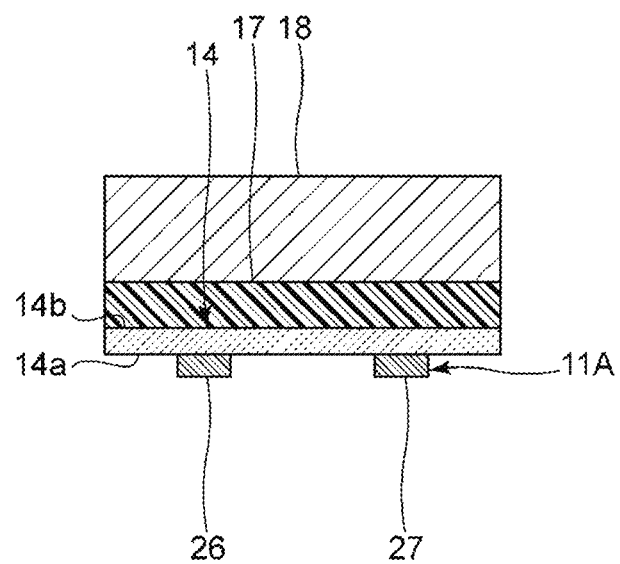
FIG. 7 illustrates a second model used in simulations of relationships between parameters of an insulating film and resonance characteristics.

As illustrated in FIG. 6, the first model is a model in which the insulating film 17 is provided on the second principal surface 14b of the piezoelectric layer 14 so as to overlap the first IDT electrode 11A in plan view and in which the wiring electrode 18 is not provided. As illustrated in FIG. 7, the second model is similar to the first preferred embodiment. More specifically, the second model is a model in which the insulating film 17 is provided on the second principal surface 14b of the piezoelectric layer 14 so as to overlap the first IDT electrode 11A in plan view and in which the wiring electrode 18 is provided on the insulating film 17. The wiring electrode 18 overlaps the first IDT electrode 11A in plan view.

The first model was used to perform simulations in which the Young's modulus and the thickness of the insulating film 17 were changed. In these simulations, the Q factor of the insulating film 17 was not taken into consideration, and the value of 1/Q was assumed to be 0. In other words, the Q factor was assumed to be infinite. Simulations in which the Q factor of the insulating film 17 was assumed to be 50 and the thickness of the insulating film 17 was changed were also performed. Design parameters of the first model are provided below. In the following description, the pitch between the electrode fingers is the center-to-center distance between adjacent ones of the electrode fingers.

Piezoelectric Layer: material LiNbO$_3$, thickness about 0.4 μm

Electrode Fingers: material Al, thickness about 0.5 μm

Pitch between Electrode Fingers: about 3.75 μm

Duty Ratio: about 0.27

Figure 8A:
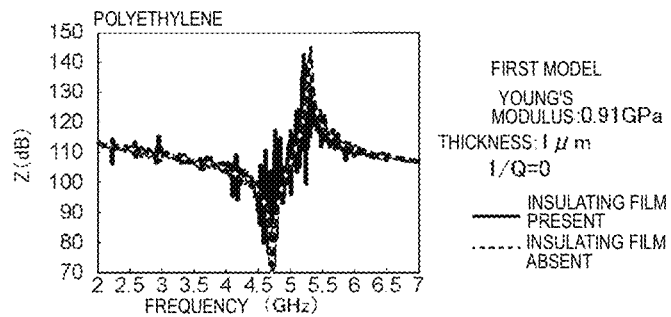
Figure 8B:
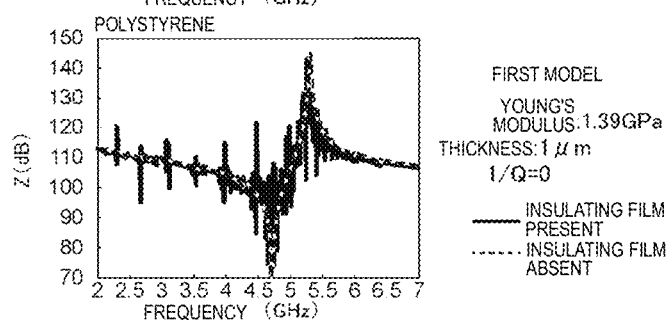
Figure 8C:
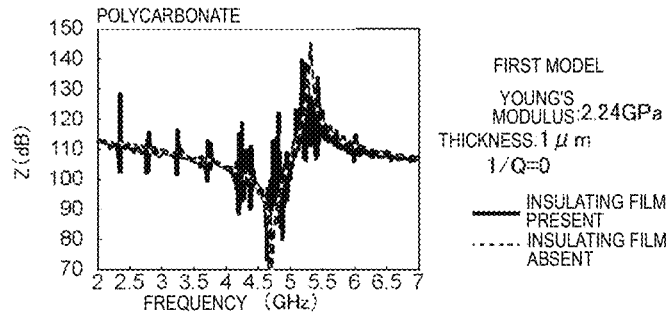
Figure 8D:
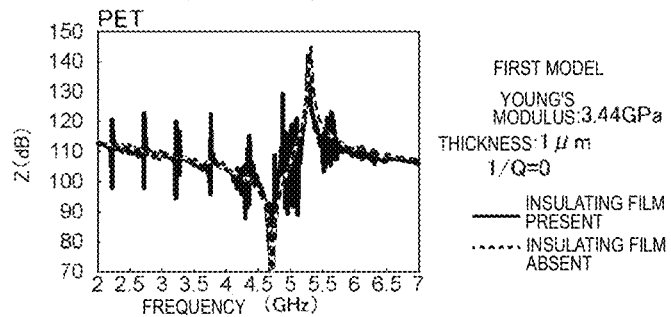
Figure 8E:
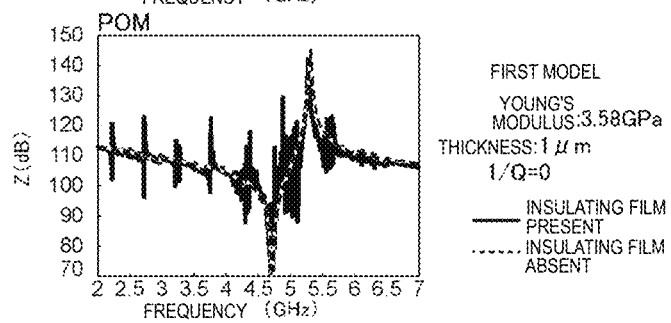

FIGS. 8A to 8E are graphs showing the results obtained by using the first model when the insulating film has a thickness of 1 μm and 1/Q=0. FIG. 8A shows the impedance frequency characteristics obtained when the material of the insulating film is polyethylene and the Young's modulus is about 0.91 GPa. FIG. 8B shows the impedance frequency characteristics obtained when the material of the insulating film is polystyrene and the Young's modulus is about 1.39 GPa. FIG. 8C shows the impedance frequency characteristics obtained when the material of the insulating film is polycarbonate and the Young's modulus is about 2.24 GPa. FIG. 8D shows the impedance frequency characteristics obtained when the material of the insulating film is polyethylene terephthalate and the Young's modulus is about 3.44 GPa. FIG. 8E shows the impedance frequency characteristics obtained when the material of the insulating film is polyacetal and the Young's modulus is about 3.58 GPa.

FIGS. 8A to 8B also show the results obtained when the insulating film 17 is not provided. The results obtained when the insulating film 17 is not provided is shown by the dashed lines. Similar dashed lines are also shown in graphs showing the results of other simulations in which the first model and the second model are used.

FIGS. 8A to 8E show that, as the Young's modulus of the insulating film 17 decreases, unwanted waves are reduced in the impedance frequency characteristics.

Figure 9A:
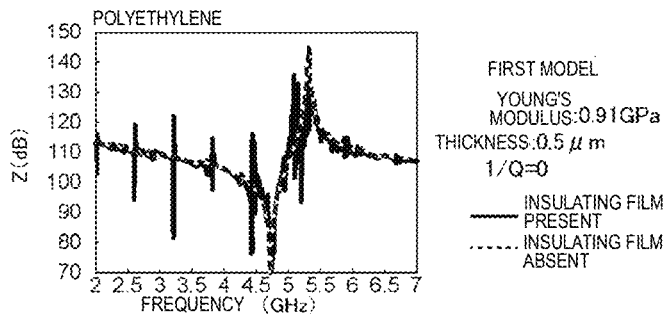
Figure 9B:
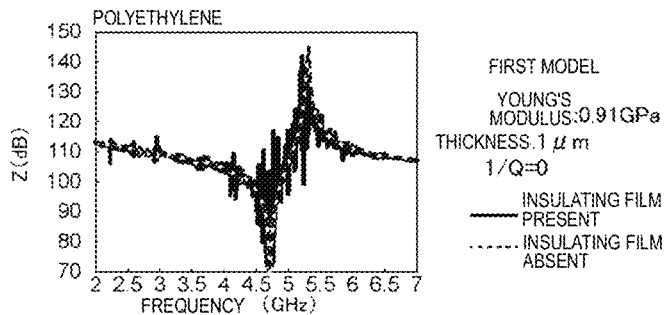
Figure 9C:
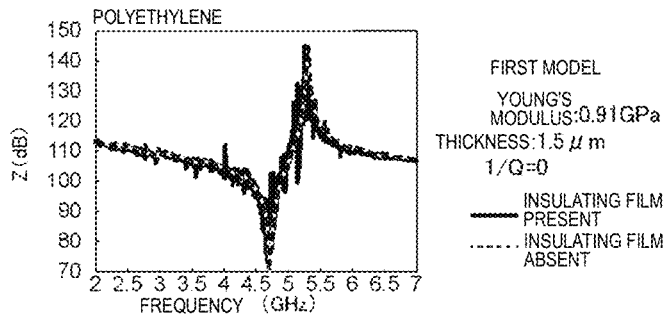
Figure 9D:
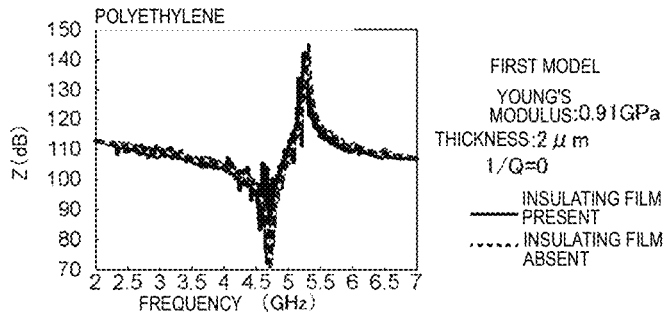
Figure 9E:
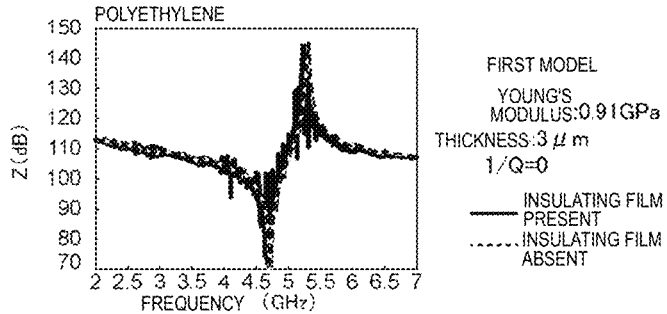

FIGS. 9A to 9E are graphs showing the results obtained by using the first model when the material of the insulating film is polyethylene and 1/Q=0. FIG. 9A shows the impedance frequency characteristics obtained when the insulating film has a thickness of about 0.5 μm. FIG. 9B shows the impedance frequency characteristics obtained when the insulating film has a thickness of about 1 μm. FIG. 9C shows the impedance frequency characteristics obtained when the insulating film has a thickness of about 1.5 μm. FIG. 9D shows the impedance frequency characteristics obtained when the insulating film has a thickness of about 2 μm. FIG. 9E shows the impedance frequency characteristics obtained when the insulating film has a thickness of about 3 μm.

As is clear from FIGS. 9A to 9E, when the insulating film 17 has a thickness of about 2 μm or more, the resonance characteristics are stable.

Figure 10A:
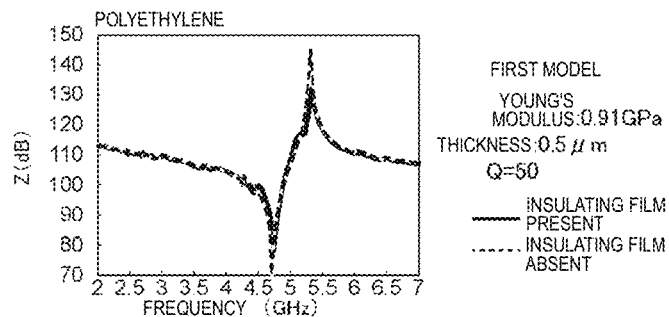
Figure 10B:
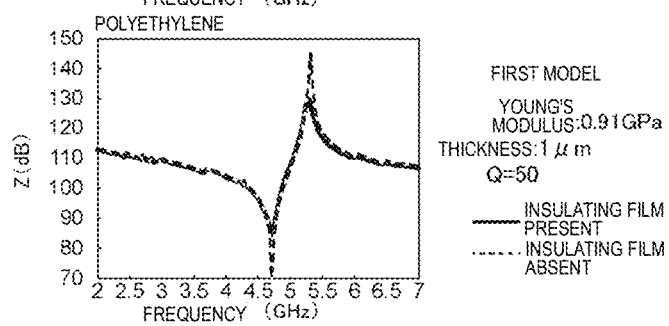
Figure 10C:
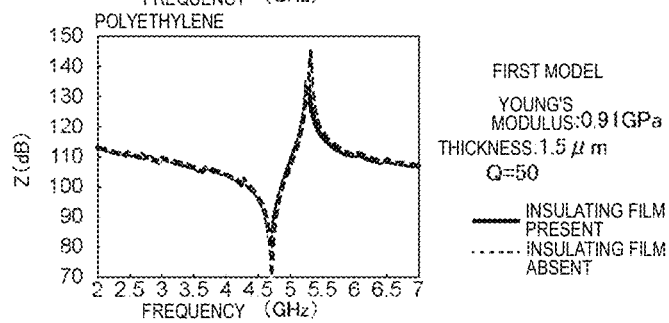
Figure 10D:
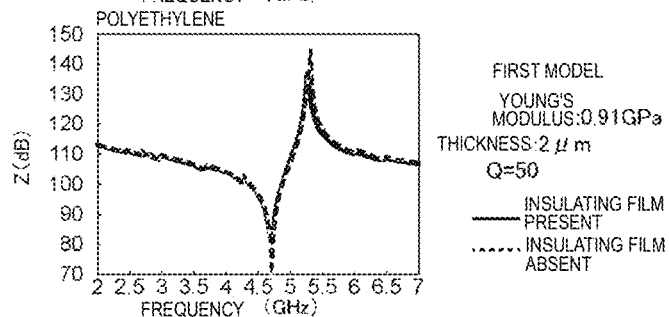
Figure 10E:
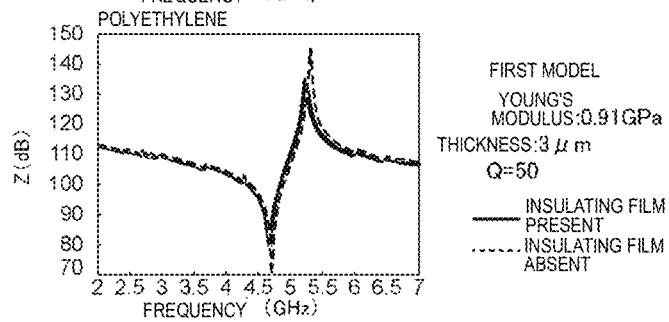

FIGS. 10A to 10E are graphs showing the results obtained by using the first model when the material of the insulating film is polyethylene and Q=50. FIG. 10A shows the impedance frequency characteristics obtained when the insulating film has a thickness of about 0.5 μm. FIG. 10B shows the impedance frequency characteristics obtained when the insulating film has a thickness of about 1 μm. FIG. 10C shows the impedance frequency characteristics obtained when the insulating film has a thickness of about 1.5 μm. FIG. 10D shows the impedance frequency characteristics obtained when the insulating film has a thickness of about 2 μm. FIG. 10E shows the impedance frequency characteristics obtained when the insulating film has a thickness of about 3 μm.

The results shown in FIGS. 9A to 9E are obtained when the Q factor is not taken into consideration. The results shown in FIGS. 10A to 10E are obtained when the Q factor is taken into consideration. When the Q factor is taken into consideration, significant generation of unwanted waves does not occur. As is clear from FIGS. 10A to 10E, when the insulating film 17 has a thickness of about 1.5 μm or more and about 3 μm or less, an impedance difference dZ between resonance and anti-resonance points is relatively large, and is about 55 dB.

The second model was used to perform simulations in which the thickness of the insulating film 17 was changed and in which the Q factor of the insulating film 17 was or was not taken into consideration. When the Q factor was taken into consideration, the Q factor was set to 50. Simulations in which the Q factor of the insulating film 17 was 1000 and in which the Young's modulus was changed were also performed. Design parameters of the second model other than the parameters of the wiring electrode 18 were the same as those of the first model. Calculations were performed assuming that the boundary condition of the wiring electrode 18 was a hot potential.

Wiring Electrode: material Al, thickness about 2 μm

Figure 11A:
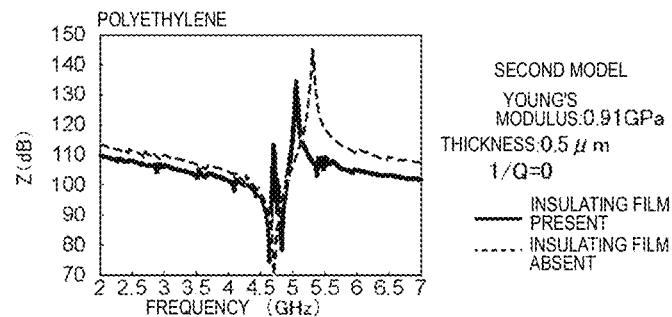
Figure 11B:
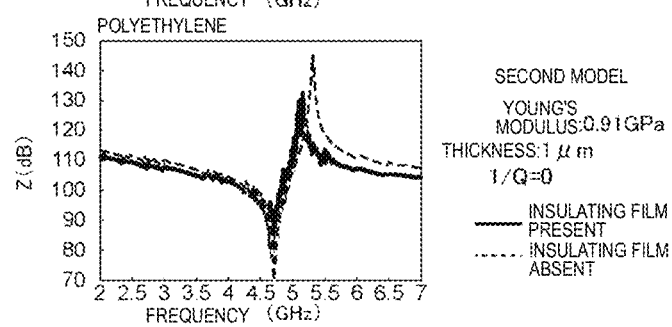
Figure 11C:
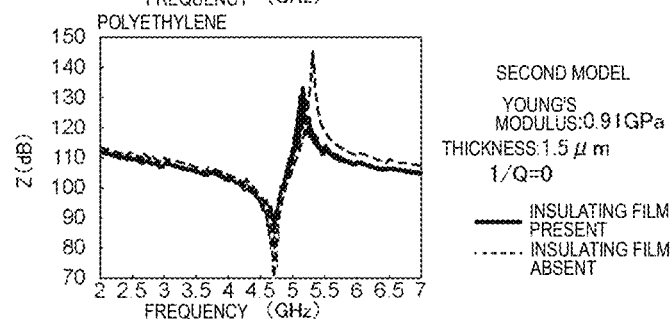
Figure 11D:
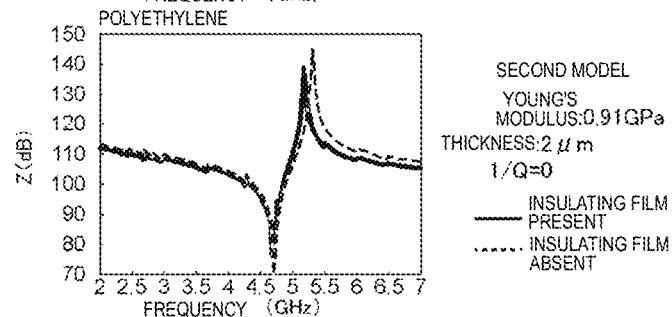
Figure 11E:
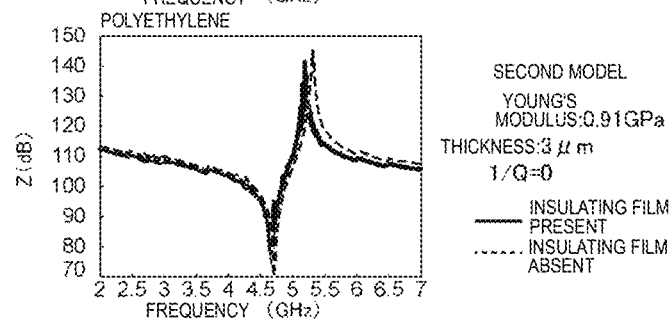

FIGS. 11A to 11E are graphs showing the results obtained by using the second model when the material of the insulating film is polyethylene and 1/Q=0. FIG. 11A shows the impedance frequency characteristics obtained when the insulating film has a thickness of about 0.5 μm. FIG. 11B shows the impedance frequency characteristics obtained when the insulating film has a thickness of about 1 μm. FIG. 11C shows the impedance frequency characteristics obtained when the insulating film has a thickness of about 1.5 μm. FIG. 11D shows the impedance frequency characteristics obtained when the insulating film has a thickness of about 2 μm. FIG. 11E shows the impedance frequency characteristics obtained when the insulating film has a thickness of about 3 μm.

As is clear from FIGS. 11A to 11E, when the insulating film 17 has a thickness of about 2 μm or more, the resonance characteristics are stable. Depending on the thickness of the insulating film 17, the band width ratio may be reduced by the influence of the parallel capacitance. The insulating film 17 preferably has a relative dielectric constant of less than 5. In such a case, the influence of the parallel capacitance can be reduced so that the band width ratio is not excessively reduced.

Figure 12A:
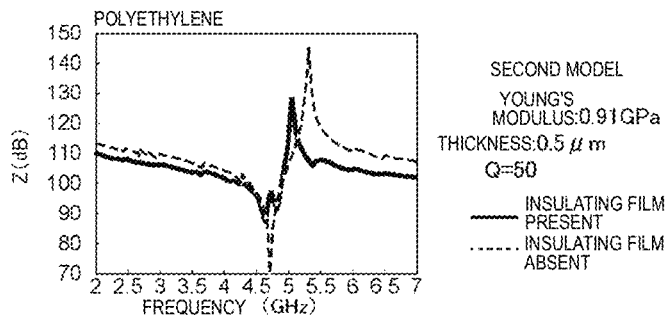
Figure 12B:
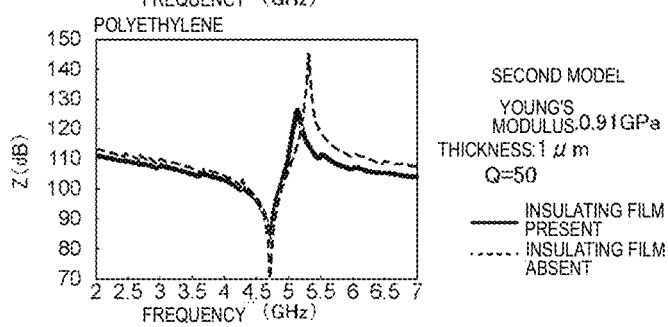
Figure 12C:
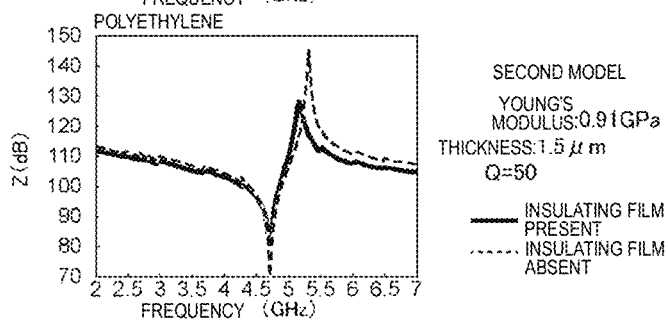
Figure 12D:
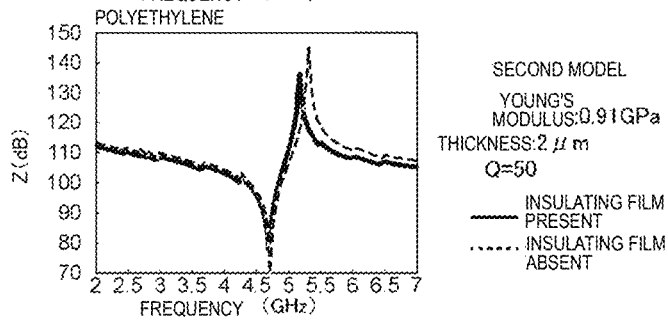
Figure 12E:
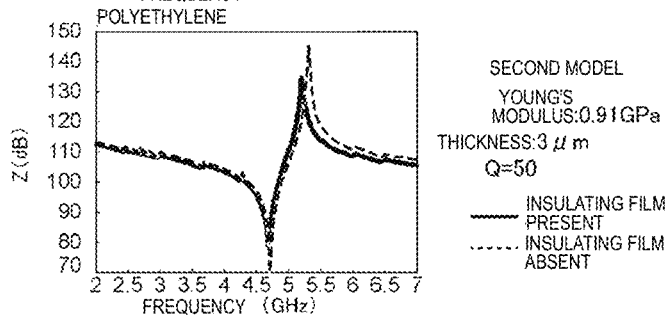

FIGS. 12A to 12E are graphs showing the results obtained by using the second model when the material of the insulating film is polyethylene and Q=50. FIG. 12A shows the impedance frequency characteristics obtained when the insulating film has a thickness of about 0.5 μm. FIG. 12B shows the impedance frequency characteristics obtained when the insulating film has a thickness of about 1 μm. FIG. 12C shows the impedance frequency characteristics obtained when the insulating film has a thickness of about 1.5 μm. FIG. 12D shows the impedance frequency characteristics obtained when the insulating film has a thickness of about 2 μm. FIG. 12E shows the impedance frequency characteristics obtained when the insulating film has a thickness of about 3 μm.

As is clear from FIGS. 12A to 12E, also when the Q factor is taken into consideration, the resonance characteristics are stable if the insulating film 17 has a thickness of about 2 μm or more. Therefore, the insulating film 17 preferably has a thickness of about 2 μm or more.

Figure 13A:
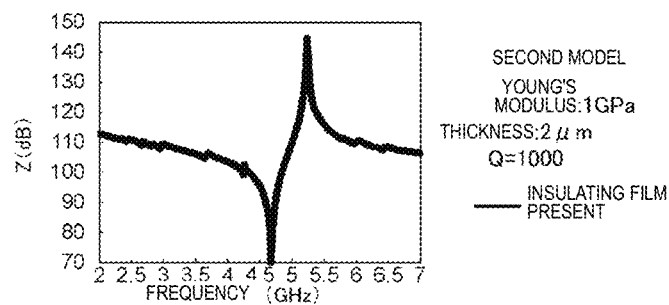
Figure 13B:
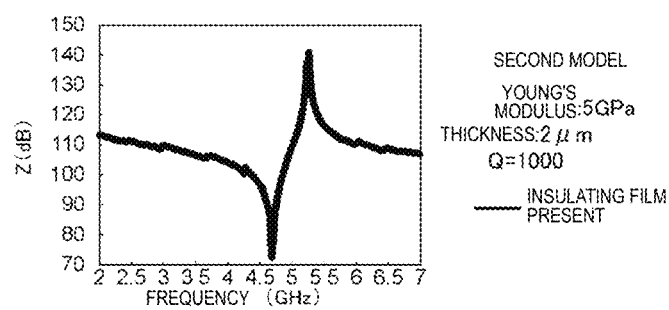
Figure 13C:
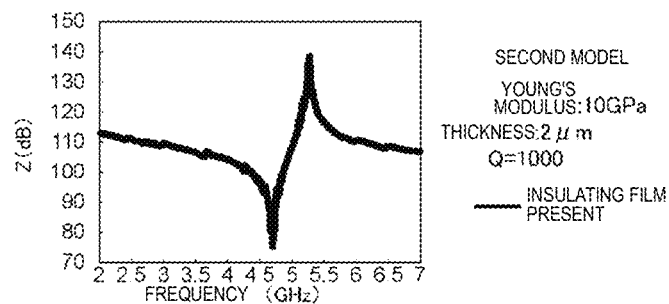
Figure 13D:
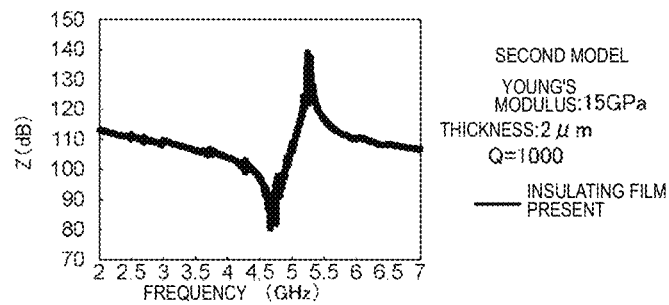
Figure 13E:
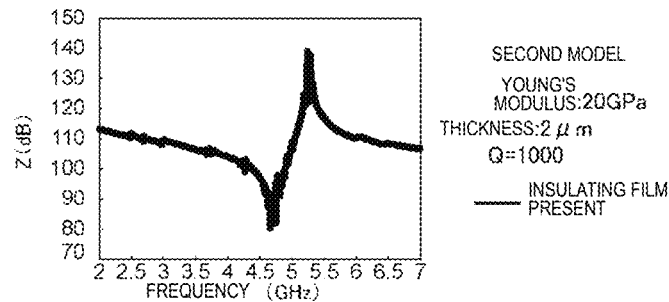

FIGS. 13A to 13E are graphs showing the results obtained by using the second model when the insulating film has a thickness of 2 μm and Q=1000. FIG. 13A shows the impedance frequency characteristics obtained when the insulating film has a Young's modulus of about 1 GPa. FIG. 13B shows the impedance frequency characteristics obtained when the insulating film has a Young's modulus of about 5 GPa. FIG. 13C shows the impedance frequency characteristics obtained when the insulating film has a Young's modulus of about 10 GPa. FIG. 13D shows the impedance frequency characteristics obtained when the insulating film has a Young's modulus of about 15 GPa. FIG. 13E shows the impedance frequency characteristics obtained when the insulating film has a Young's modulus of about 20 GPa.

As is clear from FIG. 13A to 13E, the resonance characteristics are stable when the Young's modulus is 10 GPa or less. As the Young's modulus decreases, the impedance difference dZ between the resonance and anti-resonance points can be increased. The Young's modulus is preferably about 10 GPa or less, more preferably about 5 GPa or less. Accordingly, the resonance characteristics can be stabilized and the impedance difference dZ can be increased.

An example of a method for manufacturing the acoustic wave device according to the first preferred embodiment will now be described.

Figure 15A:
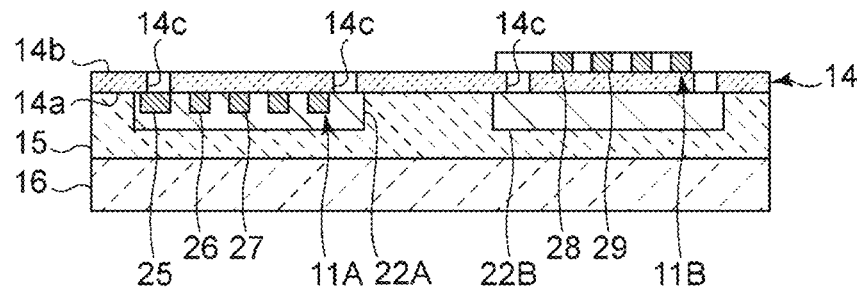
FIGS. 15A and 15B are schematic cross-sectional views corresponding to the cross section taken along line II-II in FIG. 2 and illustrating steps of the example of the method for manufacturing the acoustic wave device according to the first preferred embodiment of the present invention to a sacrificial layer removing step.
Figure 15B:
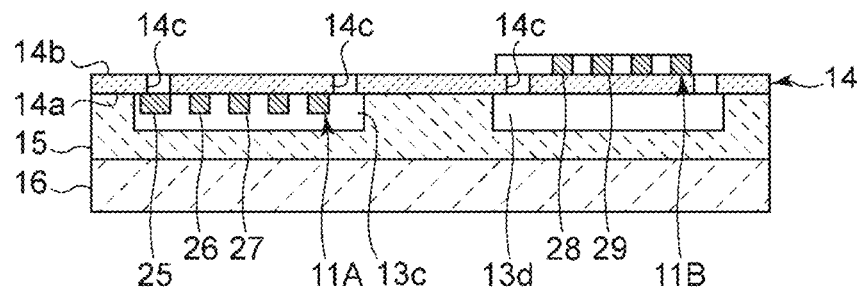
Figure 16A:
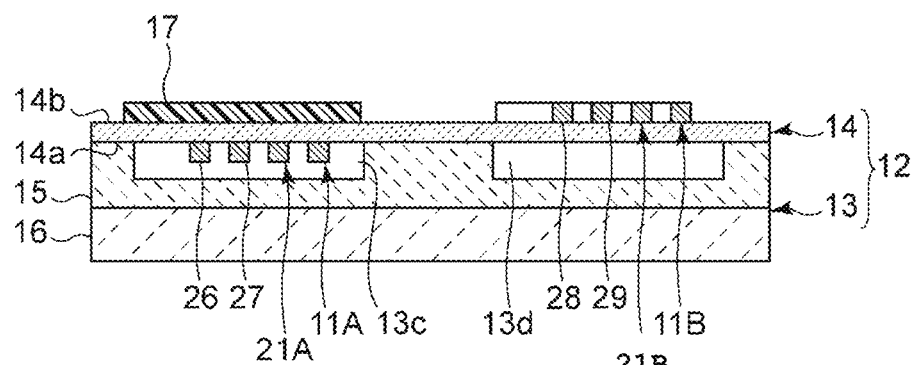
FIGS. 16A and 16B are schematic cross-sectional views corresponding to the cross section taken along line II-II in FIG. 2 and illustrating steps of the example of the method for manufacturing the acoustic wave device according to the first preferred embodiment of the present invention to a wiring electrode formation step.
Figure 16B:
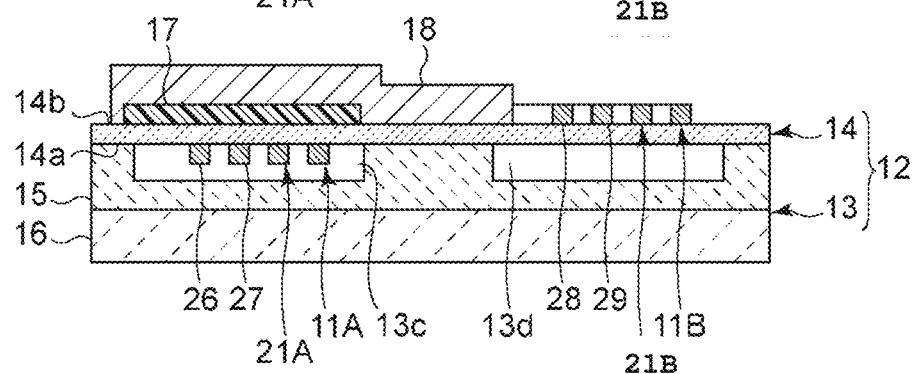

FIGS. 14A to 14E are schematic cross-sectional views corresponding to the cross section taken along line II-II in FIG. 2 and illustrating steps of the example of the method for manufacturing the acoustic wave device according to the first preferred embodiment to a second IDT electrode formation step. FIGS. 15A and 15B are schematic cross-sectional views corresponding to the cross section taken along line II-II in FIG. 2 and illustrating steps of the example of the method for manufacturing the acoustic wave device according to the first preferred embodiment to a sacrificial layer removing step. FIGS. 16A and 16B are schematic cross-sectional views corresponding to the cross section taken along line II-II in FIG. 2 and illustrating steps of the example of the method for manufacturing the acoustic wave device according to the first preferred embodiment to a wiring electrode formation step.

Figure 14A:
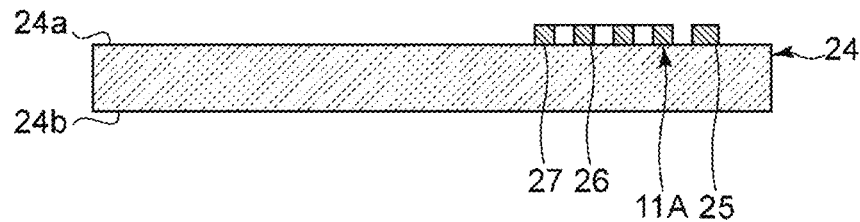
FIGS. 14A to 14E are schematic cross-sectional views corresponding to the cross section taken along line II-II in FIG. 2 and illustrating steps of an example of a method for manufacturing the acoustic wave device according to the first preferred embodiment of the present invention to a second IDT electrode formation step.

Referring to FIG. 14A, a piezoelectric substrate 24 is prepared. The piezoelectric substrate 24 is a piezoelectric layer. The piezoelectric substrate 24 includes a first principal surface 24a and a second principal surface 24b. The first principal surface 24a and the second principal surface 24b are opposite to each other. The first IDT electrode 11A and the extended wiring line 25 are provided on the first principal surface 24a. The extended wiring line 25 is provided to be connected to the first IDT electrode 11A. The first IDT electrode 11A and the extended wiring line 25 may be formed by, for example, sputtering or vacuum deposition.

Figure 14B:
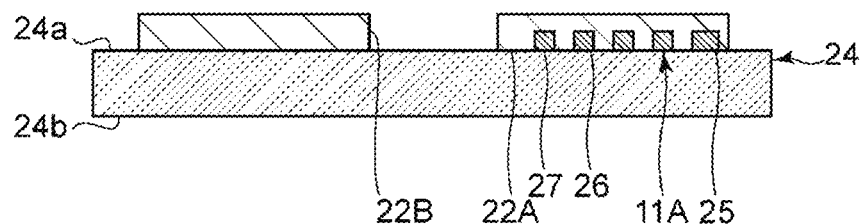

Next, as illustrated in FIG. 14B, a first sacrificial layer 22A and a second sacrificial layer 22B are formed on the first principal surface 24a of the piezoelectric substrate 24. At this time, the first sacrificial layer 22A is formed to cover at least a portion of the first IDT electrode 11A. The first sacrificial layer 22A and the second sacrificial layer 22B may be made of, for example, ZnO, $SiO_2$, Cu, or a resin.

Figure 14C:
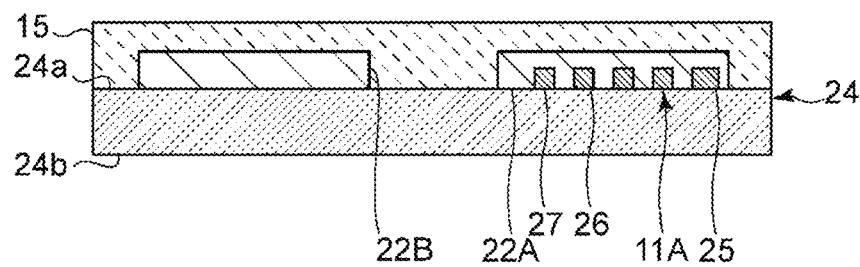

Next, as illustrated in FIG. 14C, an intermediate layer 15 is formed on the first principal surface 24a of the piezoelectric substrate 24 to cover the first sacrificial layer 22A and the second sacrificial layer 22B. The intermediate layer 15 may be formed by, for example, sputtering or vacuum deposition. Next, the intermediate layer 15 is flattened. The intermediate layer 15 may be flattened by, for example, grinding or chemical mechanical polishing (CMP).

Figure 14D:
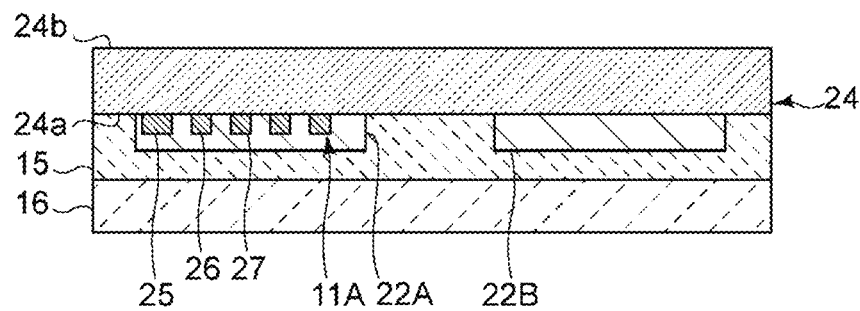

Next, as illustrated in FIG. 14D, a support substrate 16 is bonded to a principal surface of the intermediate layer 15 at a side opposite to the side at which the piezoelectric substrate 24 is provided. Thus, a multilayer body including the piezoelectric substrate 24, which serves as a piezoelectric layer, and the support substrate 16 is obtained. When the intermediate layer 15 is not formed, a recess may be formed in the support substrate 16, and then the piezoelectric substrate 24 and the support substrate 16 may be bonded together with the first IDT electrode 11 disposed in the recesses. The bonding method may be, for example, direct bonding, plasma activation bonding, or atomic diffusion bonding.

Figure 14E:
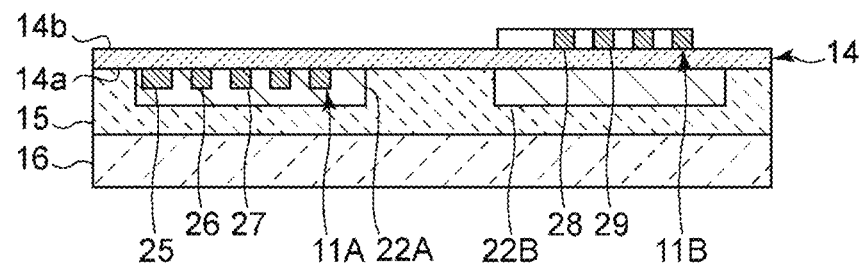

Next, the thickness of the piezoelectric substrate 24 is adjusted. More specifically, the principal surface of the piezoelectric substrate 24 that is not bonded to the support substrate 16 is ground or polished to reduce the thickness of the piezoelectric substrate 24. When d is the thickness of the piezoelectric layer and p is the center-to-center distance between adjacent ones of the electrode fingers of the first IDT electrode 11A, the thickness d is adjusted so that d/p is about 0.5 or less. The thickness of the piezoelectric substrate 24 may be adjusted by, for example, grinding, CMP, ion slicing, or etching. Thus, as illustrated in FIG. 14E, the piezoelectric layer 14 is obtained.

Next, the second IDT electrode 11B is formed on the second principal surface 14b of the piezoelectric layer 14. More specifically, the second IDT electrode 11B is formed on the second principal surface 14b at a location that does not overlap the first IDT electrode 11A in plan view. The second IDT electrode 11B is formed such that the at least a portion of the second IDT electrode 11B overlaps the second sacrificial layer 22B in plan view. When d is the thickness of the piezoelectric layer 14 and p is the center-to-center distance between adjacent ones of the electrode fingers of the second IDT electrode 11B, the second IDT electrode 11B is formed such that d/p is about 0.5 or less. The second IDT electrode 11B is formed by, for example, sputtering or vacuum deposition.

Next, as illustrated in FIG. 15A, the through holes 14c are formed in the piezoelectric layer 14. More specifically, a through hole 14c extending to the extended wiring line 25, a through hole 14c extending to the first sacrificial layer 22A, and a through hole 14c extending to the second sacrificial layer 22B are formed. The through holes 14c may be formed by, for example, reactive ion etching (RIE). Next, the first sacrificial layer 22A and the second sacrificial layer 22B are removed by using the through hole 14c extending to the first sacrificial layer 22A and the through hole 14c extending to the second sacrificial layer 22B. More specifically, an etching solution is introduced through the through holes 14c so that the first sacrificial layer 22A and the second sacrificial layer 22B in the respective recesses in the intermediate layer 15 are removed. Thus, as illustrated in FIG. 15B, the first cavity 13c and the second cavity 13d are formed.

Next, as illustrated in FIG. 16A, the insulating film 17 is formed on the second principal surface 14b of the piezoelectric layer 14. The insulating film 17 is provided on the second principal surface 14b in a region overlapping the first IDT electrode 11A in plan view. Next, as illustrated in FIG. 16B, the wiring electrode 18 is formed on the second principal surface 14b of the piezoelectric layer 14. The wiring electrode 18 is provided to be connected to the second IDT electrode 11B and extend along the insulating film 17 in the region overlapping the first IDT electrode 11A in plan view.

Next, the connection electrode 23 illustrated in FIG. 3 is formed in the through hole 14c extending to the extended wiring line 25 so that the connection electrode 23 is connected to the extended wiring line 25. Thus, the acoustic wave device 10 is obtained.

As described above, an acoustic wave device according to a preferred embodiment of the present invention may be, for example, a filter device. The filter device includes the acoustic wave resonator 21A including the first IDT electrode 11A and the acoustic wave resonator 21B including the second IDT electrode 11B. An example in which the acoustic wave device is a filter device will now be described.

Figure 17:
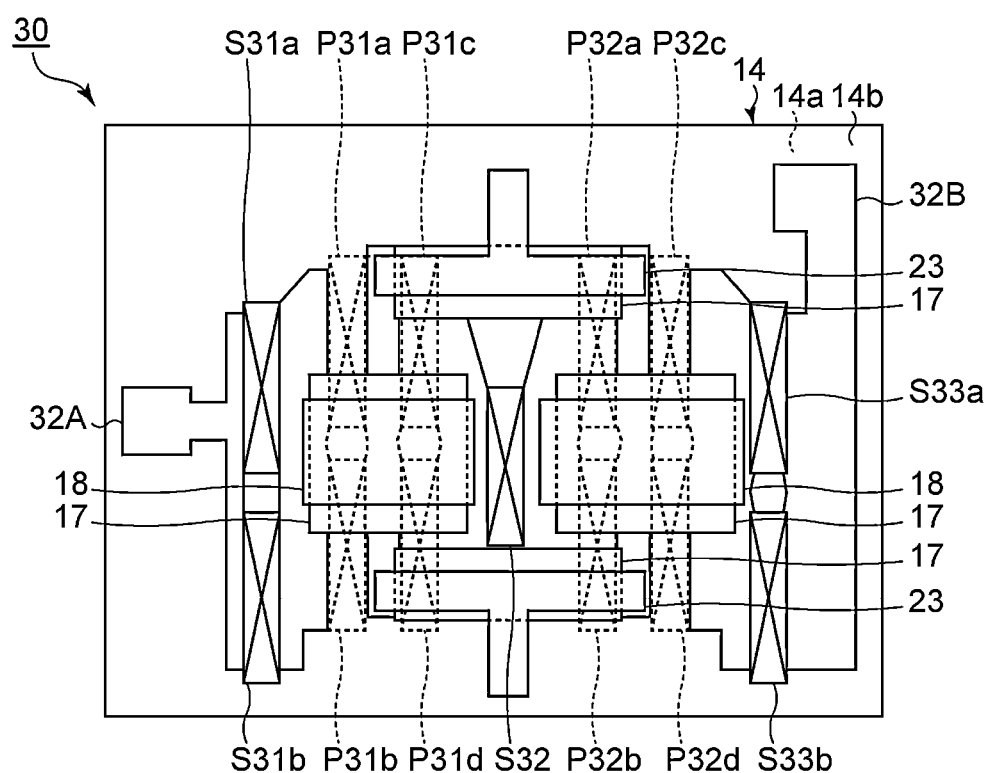
FIG. 17 is a schematic plan view of an acoustic wave device according to a second preferred embodiment of the present invention.
Figure 18:
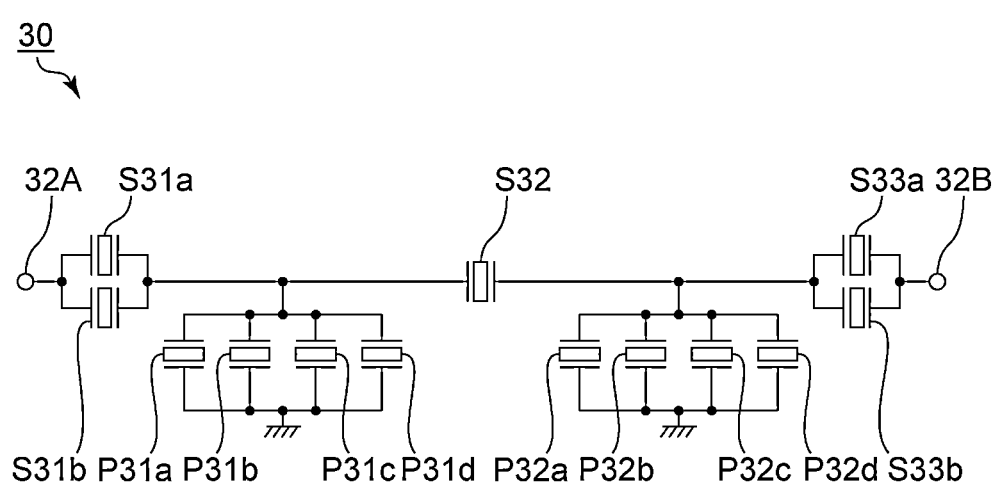
FIG. 18 is a circuit diagram of the acoustic wave device according to the second preferred embodiment of the present invention.

FIG. 17 is a schematic plan view of an acoustic wave device according to a second preferred embodiment. FIG. 18 is a circuit diagram of the acoustic wave device according to the second preferred embodiment. In FIG. 17, resonators are shown by rectangles with two diagonals.

As illustrated in FIGS. 17 and 18, an acoustic wave device 30 according to the present preferred embodiment is a ladder filter. The acoustic wave device 30 includes a plurality of series arm resonators and a plurality of parallel arm resonators. All of the parallel arm resonators and all of the series arm resonators included in the acoustic wave device 30 are acoustic wave resonators capable of using bulk waves in a thickness-shear mode.

In the present preferred embodiment, all of the series arm resonators and all of the parallel arm resonators share a piezoelectric substrate 12. The IDT electrode of each of the parallel arm resonators is a first IDT electrode. As illustrated in FIG. 17, the first IDT electrodes of all of the parallel arm resonators are provided on a first principal surface 14a of a piezoelectric layer 14. The parallel arm resonators include a parallel arm resonator P31a, a parallel arm resonator P31b, a parallel arm resonator P31c, a parallel arm resonator P31d, a parallel arm resonator P32a, a parallel arm resonator P32b, a parallel arm resonator P32c, and a parallel arm resonator P32d.

The IDT electrode of each of the series arm resonators is a second IDT electrode. The second IDT electrodes of all of the series arm resonators are provided on a second principal surface 14b of the piezoelectric layer 14. The series arm resonators include a series arm resonator S31a, a series arm resonator S31b, a series arm resonator S32, a series arm resonator S33a, and a series arm resonator S33b. The parallel arm resonators are connected to respective ones of the series arm resonators as appropriate by extended wiring lines and connection electrodes.

As illustrated in FIG. 17, a plurality of insulating films 17 are provided on the second principal surface 14b of the piezoelectric layer 14 in regions overlapping respective ones of the parallel arm resonators in plan view. In plan view, wiring electrodes 18 extend along the insulating films 17 in regions overlapping the first IDT electrodes 11A, and are connected to second IDT electrodes 11B.

Figure 19:
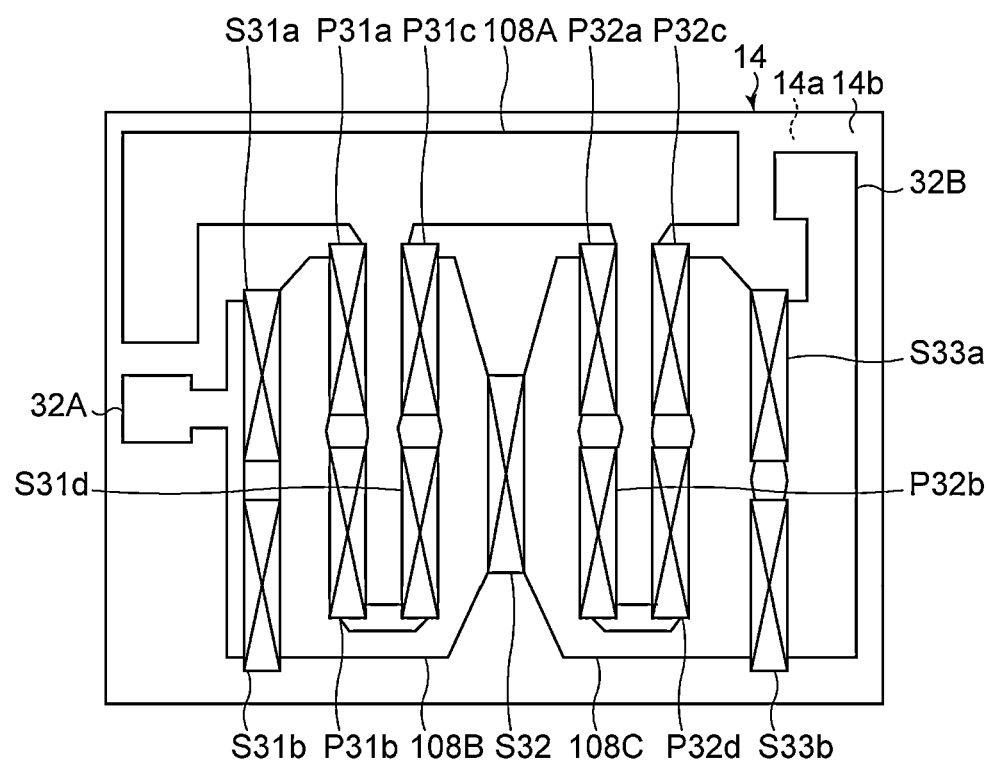
FIG. 19 is a schematic plan view of an acoustic wave device according to a third reference example.

In a third reference example illustrated in FIG. 19, all of the parallel arm resonators are provided on the second principal surface 14b of the piezoelectric layer 14. The acoustic wave device according to the third reference example does not include the insulating films 17. The circuit structure of the third reference example is the same as that of the present preferred embodiment. As illustrated in FIG. 19, in the third reference example, a wiring electrode 108A, a wiring electrode 108B, and a wiring electrode 108C extend over a large area. Accordingly, as is clear from a comparison between the present preferred embodiment and the third reference example, the size of the acoustic wave device 30 can be reduced in the present preferred embodiment.

In addition, as illustrated in FIG. 17, the acoustic wave device 30 includes connection electrodes 23 that connect the first IDT electrodes to each other. The connection electrodes 23 extend along the insulating films 17 and connect the first IDT electrodes to each other. More specifically, in plan view, the connection electrodes 23 extend through regions overlapping the first IDT electrodes. Thus, the size of the acoustic wave device 30 can be further reduced.

The circuit structure of the acoustic wave device 30 will now be described. As illustrated in FIG. 18, the acoustic wave device 30 includes an input terminal 32A and an output terminal 32B. The series arm resonator S31a and the series arm resonator S31b are connected in parallel between the input terminal 32A and the series arm resonator S32. The series arm resonator S31a and the series arm resonator S31b are divided resonators obtained as a result of parallel division of a single series arm resonator. The series arm resonator S33a and the series arm resonator S33b are connected in parallel between the series arm resonator S32 and the output terminal 32B. The series arm resonator S33a and the series arm resonator S33b are divided resonators obtained as a result of parallel division of a single series arm resonator.

The parallel arm resonator P31a, the parallel arm resonator P31b, the parallel arm resonator P31c, and the parallel arm resonator P31d are connected in parallel between the ground potential and a node between the series arm resonator S32 and the series arm resonators S31a and S31b. The parallel arm resonator P31a, the parallel arm resonator P31b, the parallel arm resonator P31c, and the parallel arm resonator P31d are divided resonators obtained as a result of parallel division of a single parallel arm resonator. The parallel arm resonator P32a, the parallel arm resonator P32b, the parallel arm resonator P32c, and the parallel arm resonator P32d are connected in parallel between the ground potential and a node between the series arm resonator S32 and the series arm resonators S33a and S33b. The parallel arm resonator P32a, the parallel arm resonator P32b, the parallel arm resonator P32c, and the parallel arm resonator P32d are divided resonators obtained as a result of parallel division of a single parallel arm resonator.

The circuit structure of the acoustic wave device 30 is not limited to the above-described structure. It is not necessary that the acoustic wave device 30 include divided resonators. The acoustic wave device 30 may include a resonator that does not include the first IDT electrode or the second IDT electrode. The acoustic wave device 30 may be any acoustic wave device including at least one acoustic wave resonator including the first IDT electrode and at least one acoustic wave resonator including the second IDT electrode.

An acoustic wave device that uses bulk waves in a thickness-shear mode will now be described in detail. The above-described first IDT electrode and the above-described second IDT electrode each have an IDT electrode structure described below. In the following description, an insulating layer corresponds to the above-described intermediate layer, and a support member corresponds to the above-described support substrate.

Figure 20A:
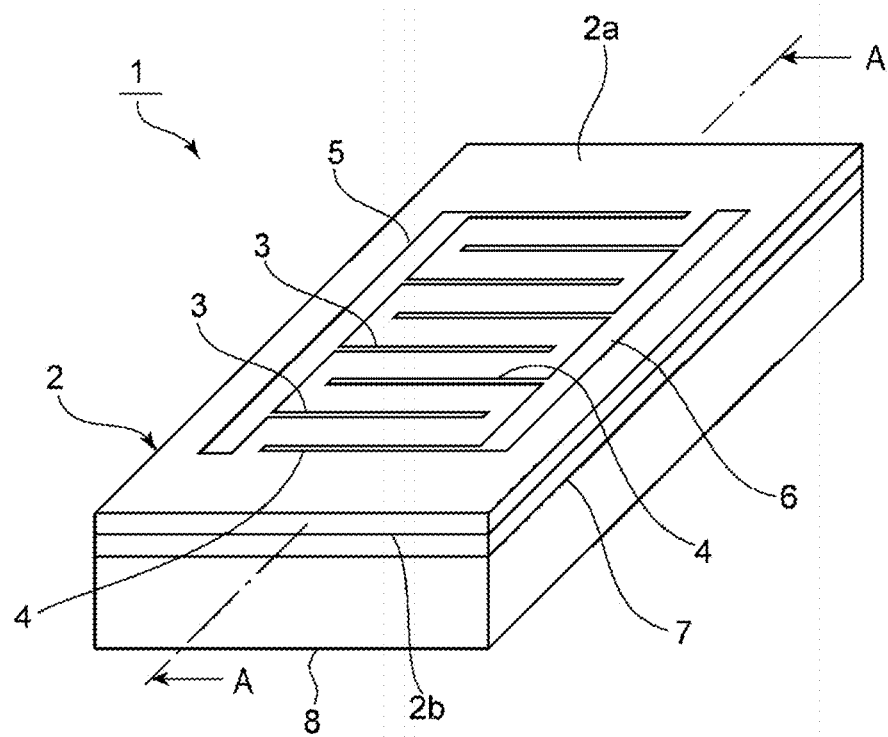
FIG. 20A is a schematic perspective view illustrating the appearance of a filter device that uses bulk waves in a thickness-shear mode.
Figure 20B:
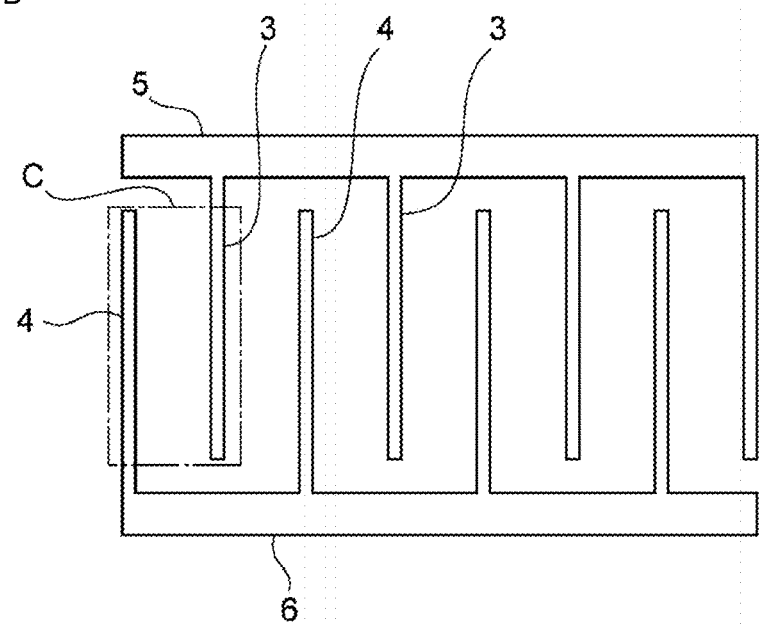
FIG. 20B is a plan view illustrating an electrode structure on a piezoelectric layer.
Figure 21:
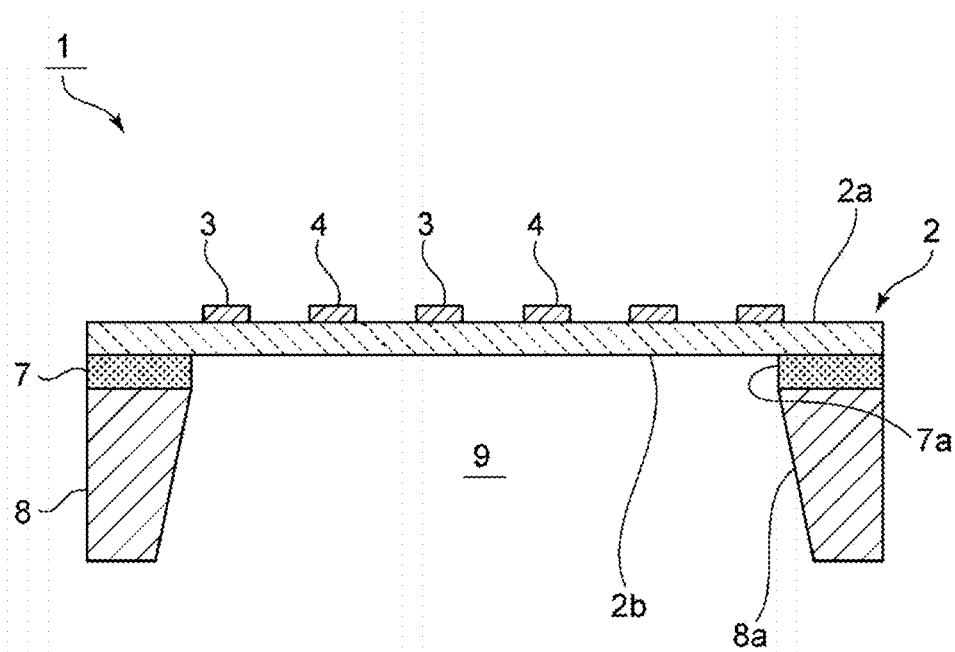
FIG. 21 is a cross-sectional view taken along line A-A in FIG. 20A.

FIG. 20A is a schematic perspective view illustrating the appearance of an acoustic wave device that uses bulk waves in a thickness-shear mode. FIG. 20B is a plan view illustrating an electrode structure on a piezoelectric layer. FIG. 21 is a cross-sectional view taken along line A-A in FIG. 20A.

The acoustic wave device 1 includes a piezoelectric layer 2 made of $LiNbO_3$. The piezoelectric layer 2 may be made of $LiTaO_3$. The cut-angle of $LiNbO_3$ or $LiTaO_3$ is Z-cut, but may be rotated Y-cut or X-cut. The thickness of the piezoelectric layer 2 is not particularly limited. However, to effectively excite a thickness-shear mode, the thickness of the piezoelectric layer 2 is preferably about 40 nm or more and about 1000 nm or less, more preferably about 50 nm or more and about 1000 nm or less. The piezoelectric layer 2 includes first and second principal surfaces 2a and 2b that are opposite to each other. Electrodes 3 and electrodes 4 are provided on the first principal surface 2a. The electrodes 3 are examples of "first electrodes", and the electrodes 4 are examples of "second electrodes". In FIGS. 20A and 20B, the electrodes 3 are connected to a first busbar 5. The electrodes 4 are connected to a second busbar 6. The electrodes 3 and the electrodes 4 interdigitate with each other. The electrodes 3 and the electrodes 4 are rectangular and have a length direction. Adjacent ones of the electrodes 3 and 4 face each other in a direction orthogonal to the length direction. The length direction of the electrodes 3 and 4 and the direction orthogonal to the length direction of the electrodes 3 and 4 are directions crossing a thickness direction of the piezoelectric layer 2. Therefore, the adjacent ones of the electrodes 3 and 4 may be regarded as facing each other in a direction crossing the thickness direction of the piezoelectric layer 2. The length direction of the electrodes 3 and 4 and the direction orthogonal to the length direction of the electrodes 3 and 4 in FIGS. 20A and 20B may be interchanged. In other words, the electrodes 3 and 4 may extend in the direction in which the first busbar 5 and the second busbar 6 extend in FIGS. 20A and 20B. In such a case, the first busbar 5 and the second busbar 6 extend in the direction in which the electrodes 3 and 4 extend in FIGS. 20A and 20B. Multiple pairs of electrodes 3 and 4 that are adjacent to each other and connected to one potential and another potential, respectively, are arranged in the direction orthogonal to the length direction of the electrodes 3 and 4. Here, the arrangement in which the electrodes 3 and 4 are adjacent to each other is not an arrangement in which the electrodes 3 and 4 are directly in contact with each other, but is an arrangement in which the electrodes 3 and 4 have an interval therebetween. When the electrodes 3 and 4 are adjacent to each other, electrodes including other electrodes 3 and 4 that are connected to a hot electrode or a ground electrode are not disposed therebetween. The number of pairs is not limited to an integer, and may be, for example, 1.5 or 2.5. The center-to-center distance between the electrodes 3 and 4, that is, the pitch, is preferably in the range of about 1 µm or more and about 10 µm or less. The width of the electrodes 3 and 4, that is, the dimension in the direction in which the electrodes 3 and 4 face each other, is preferably in the range of about 50 nm or more and about 1000 nm or less, more preferably in the range of about 150 nm or more and about 1000 nm or less. The center-to-center distance between the electrodes 3 and 4 is the distance between the center of the dimension (width) of the electrode 3 in the direction orthogonal to the length direction of the electrode 3 and the center of the dimension (width) of the electrode 4 in the direction orthogonal to the length direction of the electrode 4.

Since the acoustic wave device 1 includes the Z-cut piezoelectric layer, the direction orthogonal to the length direction of the electrodes 3 and 4 is a direction orthogonal to a polarization direction of the piezoelectric layer 2. This does not apply when a piezoelectric body with another cut-angle is used as the piezoelectric layer 2. Here, the term "orthogonal" is not used in a strict sense, and the directions may be substantially orthogonal (angle between the direction orthogonal to the length direction of the electrodes 3 and 4 and the polarization direction may be in the range of, for example, about 90°±10°).

A support member 8 is laminated to the second principal surface 2b of the piezoelectric layer 2 with an insulating layer 7 disposed therebetween. The insulating layer 7 and the support member 8 are frame shaped and have through holes 7a and 8a, respectively, as illustrated in FIG. 21. Thus, a cavity 9 is formed. The cavity 9 is provided so that vibrations of the piezoelectric layer 2 in an excitation region C are not reduced. Therefore, the support member 8 is laminated to the second principal surface 2b with the insulating layer 7 disposed therebetween at a location that does not overlap at least one pair of electrodes 3 and 4. It is not necessary that the insulating layer 7 be provided. Therefore, the support member 8 may be laminated directly or indirectly to the second principal surface 2b of the piezoelectric layer 2.

The insulating layer 7 is made of silicon oxide. The insulating layer 7 may be made of any appropriate insulating material, such as silicon oxynitride or alumina, other than silicon oxide. The support member 8 is made of Si. The orientation of the plane of Si facing the piezoelectric layer 2 may be (100), (110), or (111). The support member 8 is preferably made of Si having a resistivity as high as about 4 kΩ of more. The support member 8 may be made of any appropriate insulating material or semiconductor material.

Examples of the material of the support member 8 include aluminum oxide, piezoelectric materials such as lithium tantalate, lithium niobate, and quartz crystal, various ceramic materials such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The electrodes 3 and 4 and the first and second busbars 5 and 6 are made of an appropriate metal or alloy, such as Al or AlCu alloy. In the present preferred embodiment, the electrodes 3 and 4 and the first and second busbars 5 and 6 have a structure in which an Al film is laminated on a Ti film. An adhesion layer other than a Ti film may be used.

In operation, an alternating-current voltage is applied between the electrodes 3 and the electrodes 4. More specifically, an alternating-current voltage is applied between the first busbar 5 and the second busbar 6. Thus, resonance characteristics can be obtained by using bulk waves in a thickness-shear mode excited in the piezoelectric layer 2. In the acoustic wave device 1, when d is the thickness of the piezoelectric layer 2 and p is the center-to-center distance between adjacent electrodes 3 and 4 forming any of the pairs of electrodes 3 and 4, d/p is 0.5 or less. Therefore, bulk waves in a thickness-shear mode is effectively excited, and good resonance characteristics can be obtained. More preferably, d/p is about 0.24 or less. In such a case, the resonance characteristics can be further improved.

The acoustic wave device 1 has the above-described structure, and therefore the Q factor is not easily reduced even when the number of pairs of electrodes 3 and 4 is reduced to reduce the size of the acoustic wave device 1. This is because propagation loss is small even when the number of electrode fingers in reflectors at both sides is reduced. The number of electrode fingers can be reduced because bulk waves in a thickness-shear mode are used. The difference between Lamb waves used in an acoustic wave device and the above-described bulk waves in a thickness-shear mode will be described with reference to FIGS. 22A and 22B.

Figure 22A:
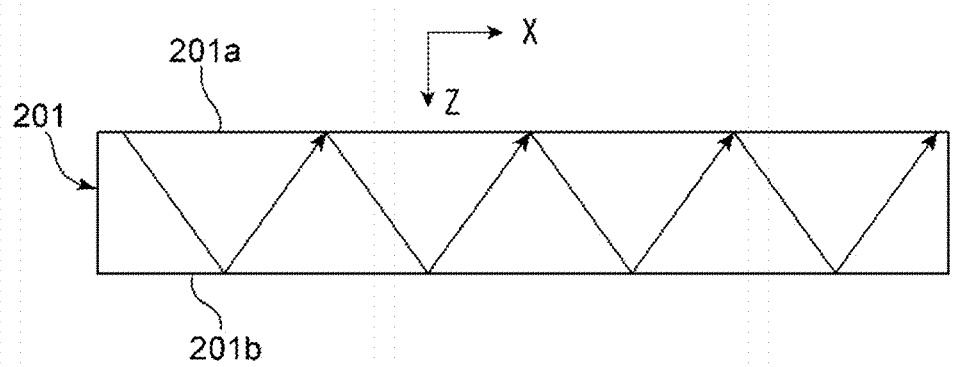
FIG. 22A is a schematic elevational cross-sectional view illustrating Lamb waves that propagate through a piezoelectric film of an acoustic wave device.

FIG. 22A is a schematic elevational cross-sectional view illustrating Lamb waves that propagate through a piezoelectric film of an acoustic wave device described in Japanese Unexamined Patent Application Publication No. 2012-257019. The waves propagate through a piezoelectric film 201 as shown by the arrows. The piezoelectric film 201 includes a first principal surface 201a and a second principal surface 201b that are opposite to each other. A thickness direction connecting the first principal surface 201a and the second principal surface 201b is a Z direction. An X direction is a direction in which electrode fingers of an IDT electrode are arranged. As illustrated in FIG. 22A, Lamb waves propagate in the X direction. The Lamb waves are plate waves, and therefore the overall body of the piezoelectric film 201 vibrates while the waves propagate in the X direction. Therefore, reflectors are disposed on both sides to obtain resonance characteristics. Accordingly, propagation loss of the waves occurs, and the Q factor is reduced when the size is reduced, that is, when the number of electrode fingers is reduced.

Figure 22B:
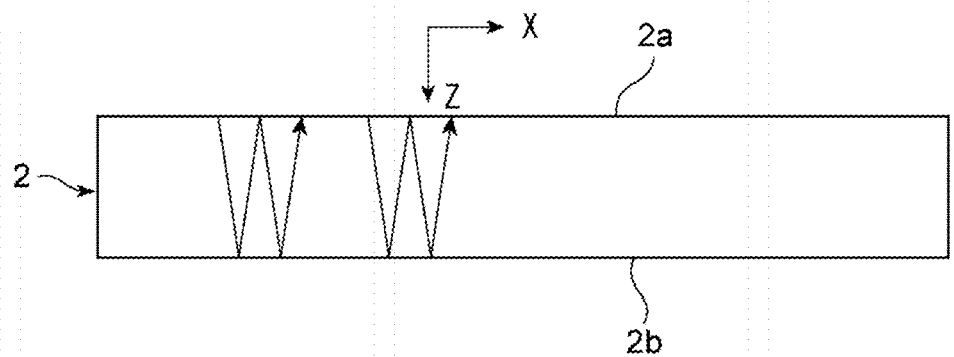
FIG. 22B is a schematic elevational cross-sectional view illustrating bulk waves in a thickness-shear mode that propagates through a piezoelectric film of a filter device.

In contrast, as illustrated in FIG. 22B, in the acoustic wave device 1, the vibration displacement is in the thickness shear direction. Therefore, the waves substantially propagate in the direction connecting the first principal surface 2a and the second principal surface 2b of the piezoelectric layer 2, that is, in the Z direction, and resonate. In other words, X-direction components of the waves are significantly smaller than Z-direction components of the waves. The resonance characteristics are obtained by the propagation of the waves in the Z direction, and therefore propagation loss does not easily occur even when the number of electrode fingers in the reflectors is reduced. Furthermore, even when the number of pairs of electrodes 3 and 4 is reduced to reduce the size, the Q factor is not easily reduced.

Figure 23:
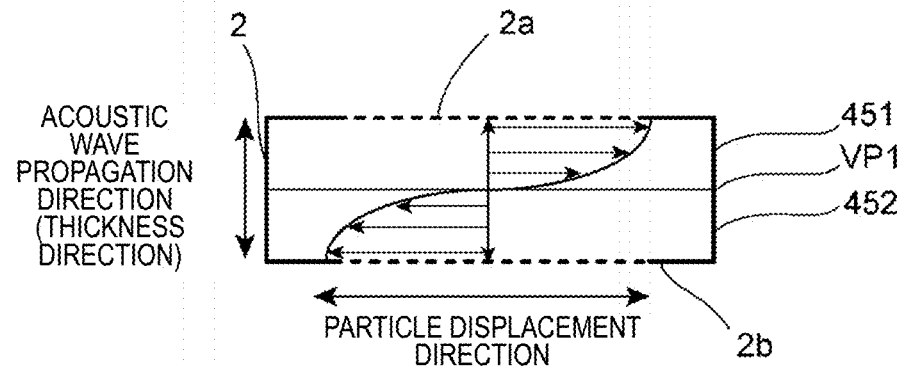
FIG. 23 illustrates amplitude directions of bulk waves in a thickness-shear mode.

As illustrated in FIG. 23, a bulk wave in a thickness-shear mode has opposite amplitude directions in a first region 451 and a second region 452 that are included in the excitation region C of the piezoelectric layer 2. FIG. 23 schematically illustrates a bulk wave generated when a voltage is applied between the electrodes 3 and 4 so that the potential at the electrode 4 is higher than that at the electrode 3. The first region 451 is a region of the excitation region C between the first principal surface 2a and an imaginary plane VP1 that is orthogonal to the thickness direction of the piezoelectric layer 2 and bisects the piezoelectric layer 2. The second region 452 is a region of the excitation region C between the imaginary plane VP1 and the second principal surface 2b.

As described above, the acoustic wave device 1 includes at least one pair of electrodes including the electrodes 3 and 4. Since the waves do not propagate in the X direction, it is not necessary that the number of pairs of electrodes including the electrodes 3 and 4 be more than one. In other words, it is only necessary that at least one pair of electrodes be provided.

For example, the above-described electrodes 3 are electrodes connected to a hot potential, and the electrodes 4 are electrodes connected to a ground potential. Alternatively, the electrodes 3 may be connected to a ground potential, and the electrodes 4 may be connected to a hot potential. In the present preferred embodiment, as described above, at least one pair of electrodes includes an electrode connected to a hot potential or an electrode connected to a ground potential, and no floating electrode is provided.

Figure 24:
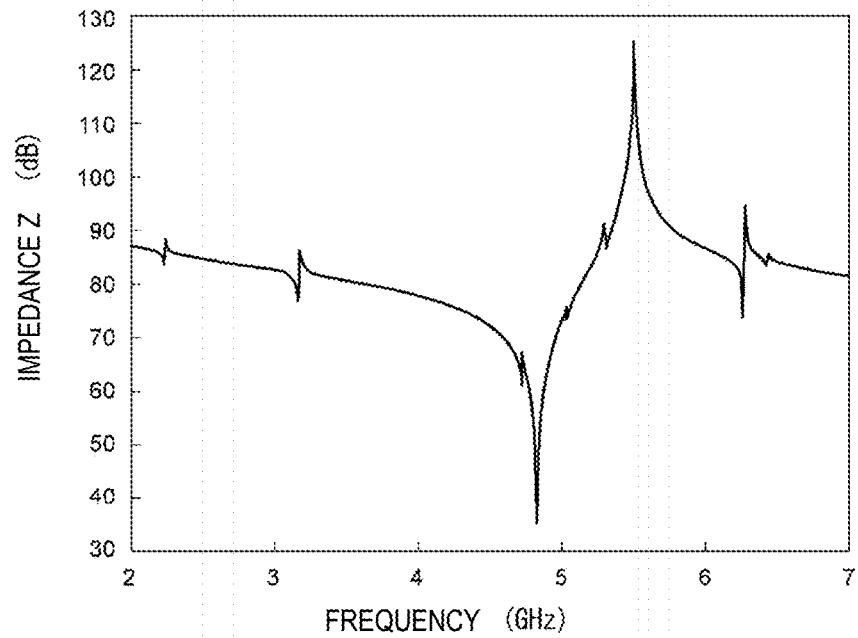
FIG. 24 is a graph showing resonance characteristics of a filter device that uses bulk waves in a thickness-shear mode.

FIG. 24 is a graph showing the resonance characteristics of the acoustic wave device illustrated in FIG. 21. Design parameters of the acoustic wave device 1 having the resonance characteristics are as follows.

Piezoelectric Layer 2: LiNbO$_3$ with Euler angles (0°, 0°, 90°), thickness about 400 nm When viewed in a direction orthogonal to the length direction of the electrodes 3 and 4, the region in which the electrodes 3 and 4 overlap, that is, the excitation region C, has a length of about 40 μm. The number of pairs of electrodes including the electrodes 3 and 4 is 21. The center-to-center distance between the electrodes is about 3 µm. The width of the electrodes 3 and 4 is about 500 nm, and d/p=about 0.133.

Insulating Layer 7: Silicon oxide film with a thickness of about 1 µm.

Support Member 8: Si

The length of the excitation region C is the dimension of the excitation region C in the length direction of the electrodes 3 and 4.

In the present preferred embodiment, the distance between the electrodes 3 and 4 forming a pair is the same for all of the pairs of electrodes. In other words, the electrodes 3 and the electrodes 4 are arranged so that the pitch therebetween is constant.

As is clear from FIG. 24, although no reflectors are provided, good resonance characteristics with a band width ratio of about 12.5% are obtained.

As described above, in the present preferred embodiment, when d is the thickness of the piezoelectric layer 2 and p is the center-to-center distance between the electrodes 3 and 4, d/p is about 0.5 or less, more preferably about 0.24 or less. This will be described below with reference to FIG. 25.

Figure 25:
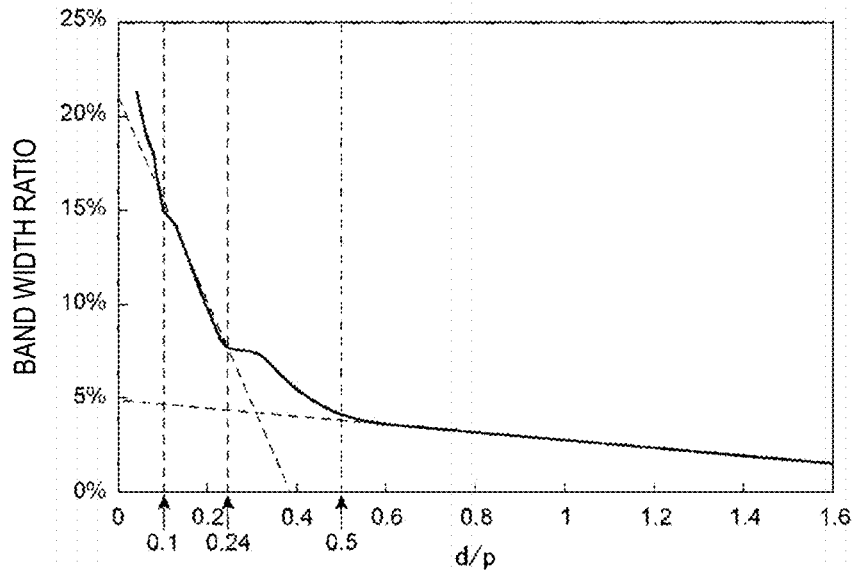
FIG. 25 is a graph showing the relationship between d/p and the band width ratio of a resonator when p is the center-to-center distance between adjacent electrodes and d is the thickness of a piezoelectric layer.

A plurality of acoustic wave devices that are similar to the acoustic wave device having the resonance characteristics shown in FIG. 24 but have different values of d/p were prepared. FIG. 25 is a graph showing the relationship between d/p and the band width ratio of each acoustic wave device as a resonator.

As is clear from FIG. 25, in the case where d/p>about 0.5, the band width ratio remains below about 5% even when d/p is adjusted. In contrast, in the case where d/p≤about 0.5, the band width ratio can be increased to about 5% or more by changing d/p within this range. Thus, a resonator having a high coupling coefficient can be obtained. In the case where d/p is about 0.24 or less, the band width ratio can be increased to about 7% or more. By adjusting d/p within this range, a resonator having a higher band width ratio can be obtained, that is, a resonator having a higher coupling coefficient can be realized. Thus, it has been discovered that, when d/p is about 0.5 or less, a resonator that uses bulk waves in a thickness-shear mode and has a high coupling coefficient can be obtained.

Figure 26:
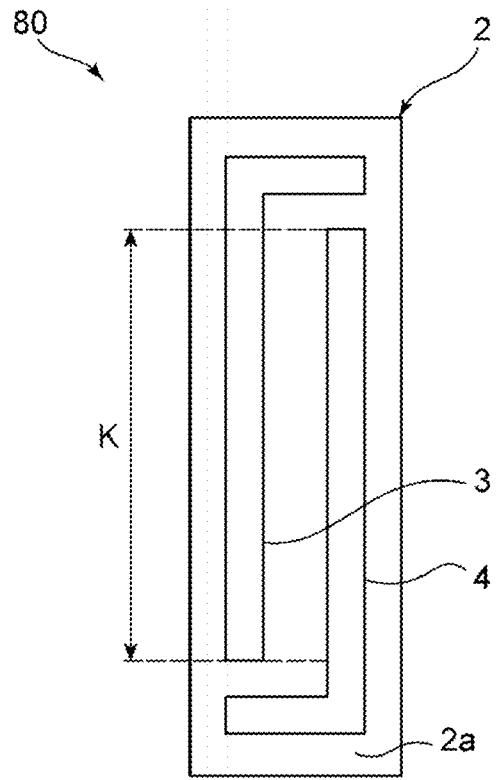
FIG. 26 is a plan view of an acoustic wave device that uses bulk waves in a thickness-shear mode.

FIG. 26 is a plan view of an acoustic wave device that uses bulk waves in a thickness-shear mode. An acoustic wave device 80 includes a pair of electrodes including electrodes 3 and 4 on a first principal surface 2a of a piezoelectric layer 2. In FIG. 26, K shows a cross width. As described above, in an acoustic wave device according to a preferred embodiment of the present invention, the number of pairs of electrodes may be one. Also in this case, bulk waves in a thickness-shear mode can be effectively excited when d/p is about 0.5 or less.

Figure 27:
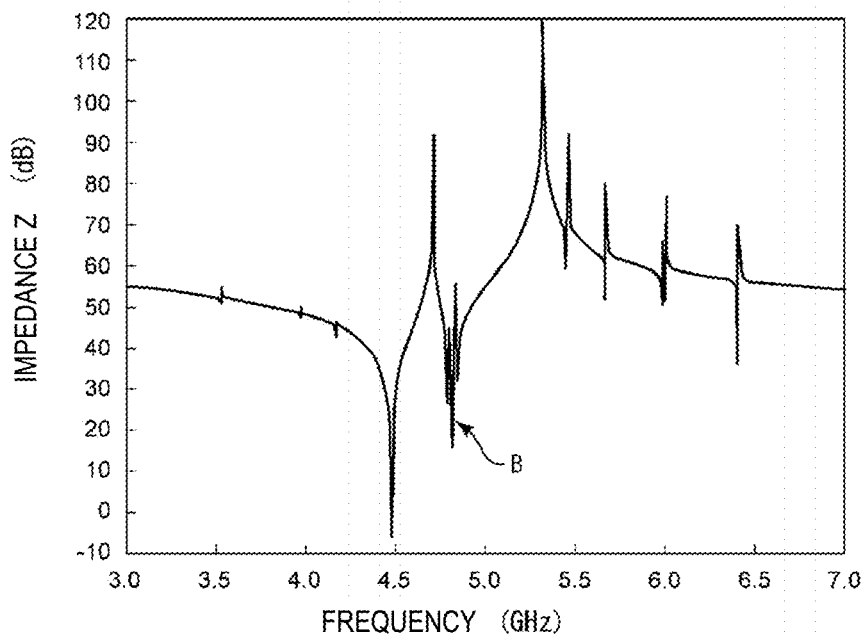
FIG. 27 is a graph showing the resonance characteristics of an acoustic wave device according to a reference example having spurious.

In the acoustic wave device 1, any adjacent ones of the electrodes 3 and 4 preferably have a metallization ratio MR that satisfies MR about 1.75(d/p)+0.075 in the excitation region C, which is a region in which the adjacent electrodes 3 and 4 overlap when viewed in the direction in which the electrodes 3 and 4 face each other. In such a case, spurious is effectively reduced. This will be described with reference to FIGS. 27 and 28. FIG. 27 is a reference graph showing an example of resonance characteristics of the acoustic wave device 1. Arrow B shows spurious appearing between resonant and anti-resonant frequencies. It is assumed that d/p=about 0.08 and that the Euler angles of LiNbO$_3$ are (0°, 0°, 90°). The metallization ratio MR is about 0.35.

The metallization ratio MR will be described with reference to FIG. 20B. Focusing on one pair of electrodes 3 and 4 in the electrode structure shown in FIG. 20B, assume that only this pair of electrodes 3 and 4 is provided. In this case, the region surrounded by the one-dot chain line serves as the excitation region C. The excitation region C includes a region of the electrode 3 that overlaps the electrode 4, a region of the electrode 4 that overlaps the electrode 3, and a region of an area between the electrodes 3 and 4 in which the electrodes 3 and 4 overlap when the electrodes 3 and 4 are viewed in a direction orthogonal to the length direction of the electrodes 3 and 4, that is, the direction in which the electrodes 3 and 4 face each other. The metallization ratio MR is the area of the electrodes 3 and 4 in the excitation region C relative to the area of the excitation region C. In other words, the metallization ratio MR is the ratio of the area of metallized portions to the area of the excitation region C.

When multiple pairs of electrodes are provided, MR can be determined as the ratio of the area of metalized portions included in all of the excitation regions to the total area of the excitation regions.

Figure 28:
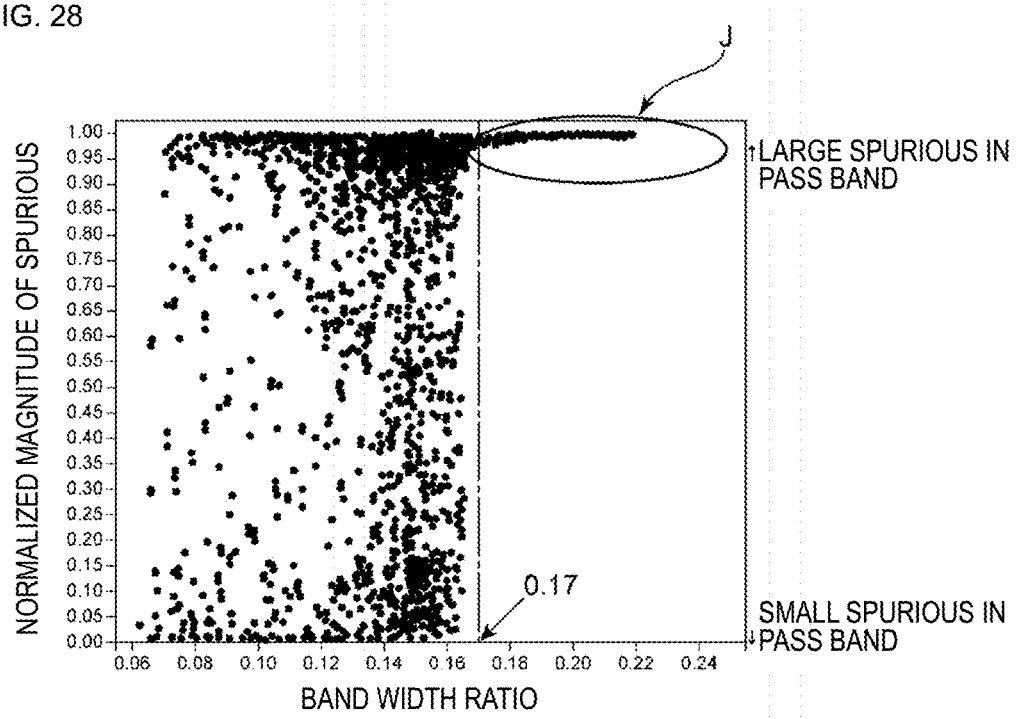
FIG. 28 is a graph showing the relationship between the band width ratio and the phase rotation angle of the spurious impedance normalized by 180 degrees as the magnitude of spurious.

FIG. 28 is a graph showing the relationship between the band width ratio and the phase rotation angle of the spurious impedance normalized by 180 degrees as the magnitude of spurious when a large number of acoustic wave resonators are provided in accordance with the present preferred embodiment. The band width ratio is adjusted by changing the film thickness of the piezoelectric layer and the dimensions of the electrodes. Although FIG. 28 shows the results obtained when the piezoelectric layer is made of Z-cut LiNbO$_3$, similar results are obtained when the piezoelectric layer has another cut-angle.

In the region surrounded by the ellipse J in FIG. 28, the magnitude of spurious is as large as about 1.0. As is clear from FIG. 28, when the band width ratio exceeds about 0.17, that is, about 17%, large spurious with a spurious level of 1 or more appears in the pass band even when parameters affecting the band width ratio are changed. In other words, as in the resonance characteristics shown in FIG. 27, large spurious shown by arrow B appears in the pass band. Therefore, the band width ratio is preferably about 17% or less. In such a case, spurious can be reduced by adjusting the film thickness of the piezoelectric layer 2 and the dimensions of the electrodes 3 and 4.

Figure 29:
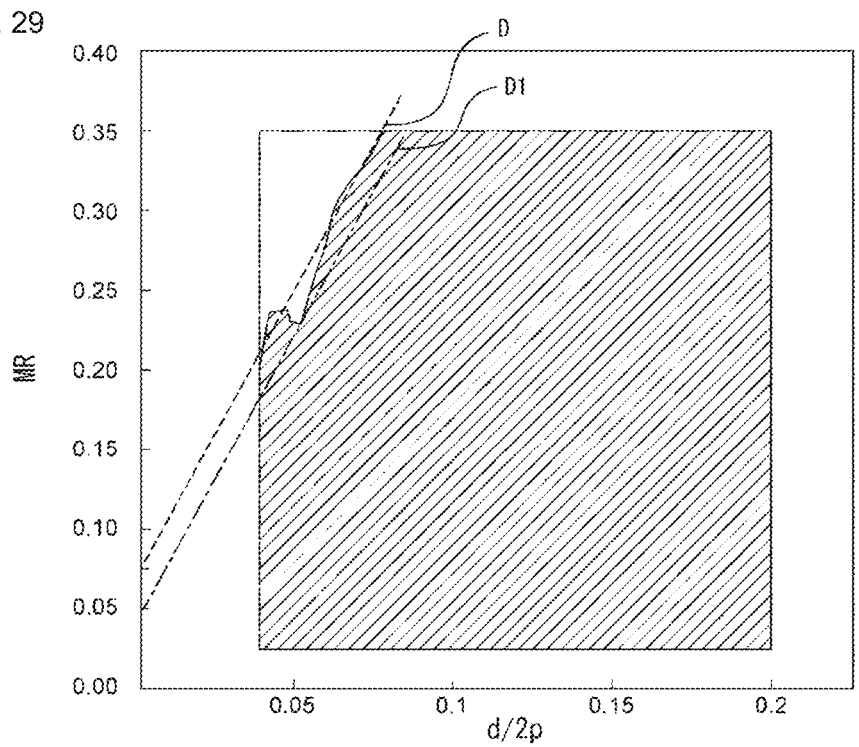
FIG. 29 is a graph showing the relationship between d/2p and the metallization ratio MR.

FIG. 29 is a graph showing the relationship between d/2p, the metallization ratio MR, and the band width ratio. Acoustic wave devices similar to the above-described acoustic wave device and having different values of d/2p and MR were prepared, and the band width ratios thereof were measured. In FIG. 29, the hatched region on the right side of the dashed line D is the region in which the band width ratio is about 17% or less. The boundary between the hatched region and the region that is not hatched is represented by MR=3.5(d/2p)+0.075, or MR=1.75(d/p)+0.075. Therefore, MR≤1.75(d/p)+0.075 is preferably satisfied. In such a case, the band width ratio can be easily set to about 17% or less. The region on the right side of the one-dot chain line D1, which is represented by MR=3.5(d/2p)+0.05, in FIG. 29 is more preferable. When MR≤1.75(d/p)+0.05 is satisfied, the band width ratio can be reliably set to about 17% or less.

Figure 30:
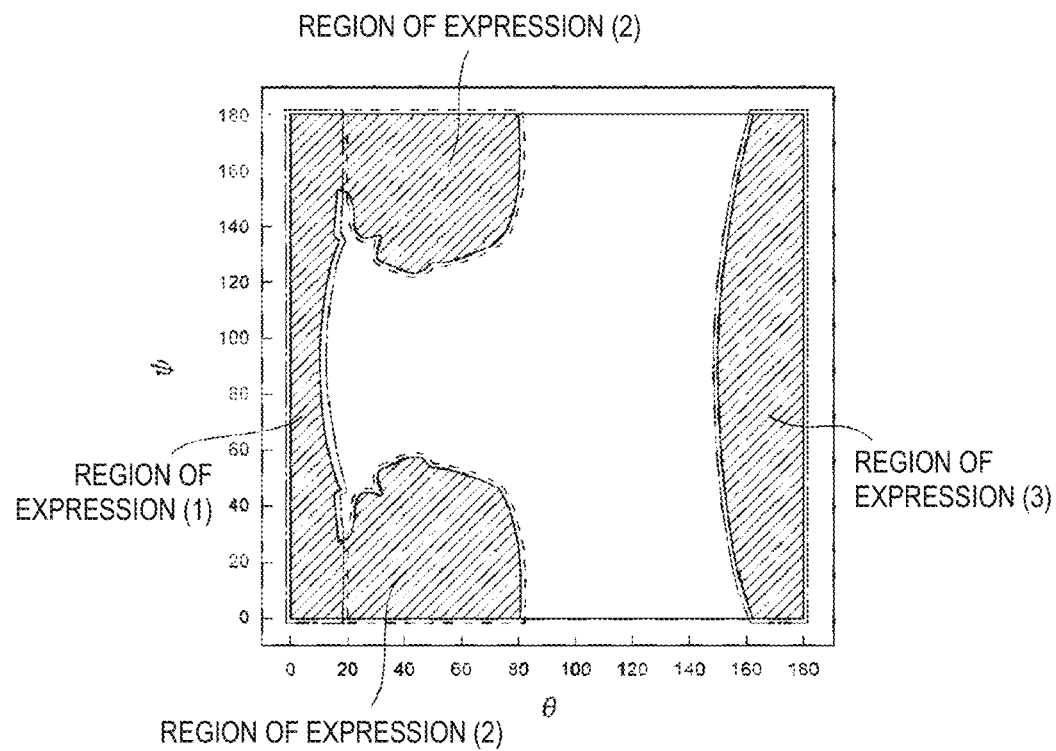
FIG. 30 shows a map of the band width ratio with respect to Euler angles (0°, θ, ψ) of $LiNbO_3$ when d/p is nearly 0.

FIG. 30 shows a map of the band width ratio with respect to the Euler angles (0°, θ, ψ) of LiNbO$_3$ when d/p is nearly 0. The hatched regions in FIG. 30 are regions in which the band width ratio is at least about 5% or more. These regions can be approximated to regions represented by Expressions (1), (2), and (3) provided below.

$$(0°\pm10°, 0° \text{ to } 20°, \text{any } \psi) \quad \text{Expression (1)}$$

$$(0°\pm10°, 20° \text{ to } 80°, 0° \text{ to } 60°(1-(\theta-50)^2/900)^{1/2}) \text{ or}$$
$$(0°\pm10°, 20° \text{ to } 80°, [180°-60°(1-(\theta-50)^2/900)^{1/2}] \text{ to } 180°) \quad \text{Expression (2)}$$

$$(0°\pm10°, [180°-30°(1-(\psi-90)^2/8100)^{1/2}] \text{ to } 180°, \text{any } \psi) \quad \text{Expression (3)}$$

Therefore, when the Euler angles satisfy Expression (1), (2), or (3), the band width ratio can be sufficiently increased. This also applies when the piezoelectric layer 2 is a lithium tantalate layer.

In the acoustic wave devices according to the first and second preferred embodiments, as described above, d/p is preferably about 0.24 or less in at least one of the first and second IDT electrodes. In such a case, the resonance characteristics can be further improved. In addition, in the acoustic wave devices according to the first and second preferred embodiments, as described above, MR≤1.75(d/p)+0.075 is preferably satisfied in at least one of the first and second IDT electrodes. In such a case, spurious can be reliably reduced.

In the acoustic wave devices according to the first and second preferred embodiments, the piezoelectric layer is preferably a lithium niobate layer or a lithium tantalate layer. The piezoelectric layer is preferably formed of lithium niobate or lithium tantalate with Euler angles ($\varphi$, $\theta$, $\psi$) in the ranges of Expression (1), Expression (2), or Expression (3) provided above. In such a case, the band width ratio can be sufficiently increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support including a support substrate;
a piezoelectric layer provided on the support and including a first principal surface adjacent to the support and a second principal surface opposite to the first principal surface;
a first IDT electrode provided on the first principal surface and including a plurality of electrode fingers; and
a second IDT electrode provided on the second principal surface in a region that does not overlap the first IDT electrode in plan view, the second IDT electrode including a plurality of electrode fingers; wherein
when d is a thickness of the piezoelectric layer and p is a center-to-center distance between adjacent ones of the electrode fingers, d/p is about 0.5 or less in the first IDT electrode and the second IDT electrode; and
the acoustic wave device further comprises:
an insulating film provided on the second principal surface in a region overlapping the first IDT electrode in plan view; and
a wiring electrode extending along the insulating film in the region overlapping the first IDT electrode in plan view, the wiring electrode being connected to the second IDT electrode.

2. The acoustic wave device according to claim 1, wherein
the support includes a cavity in which the first IDT electrode is located;
the piezoelectric layer includes a through hole extending to the cavity; and
the acoustic wave device further comprises a connection electrode extending through the through hole and connected to the first IDT electrode.

3. The acoustic wave device according to claim 2, wherein
the support includes an intermediate layer between the support substrate and the piezoelectric layer; and
at least a portion of the cavity is provided in the intermediate layer.

4. The acoustic wave device according to claim 3, wherein
the cavity is a first cavity; and
at least a portion of a second cavity is provided in the intermediate layer in a region overlapping the second IDT electrode in plan view.

5. The acoustic wave device according to claim 1, wherein the insulating film has a Young's modulus of about 10 GPa or less.

6. The acoustic wave device according to claim 1, wherein the insulating film has a relative dielectric constant of less than about 5.

7. The acoustic wave device according to claim 1, wherein the insulating film is a resin film.

8. The acoustic wave device according to claim 1, wherein the insulating film has a thickness of about 2 μm or more.

9. The acoustic wave device according to claim 1, wherein d/p is about 0.24 or less in at least one of the first IDT electrode and the second IDT electrode.

10. The acoustic wave device according to claim 1, wherein, in each of the first IDT electrode and the second IDT electrode, an excitation region is a region in which adjacent ones of the electrode fingers overlap when viewed in a direction in which the electrode fingers face each other, and when MR is a metallization ratio of the plurality of electrode fingers with respect to the excitation region, MR≤1.75(d/p)+0.075 is satisfied in at least one of the first IDT electrode and the second IDT electrode.

11. The acoustic wave device according to claim 1, wherein the piezoelectric layer is a lithium tantalate layer or a lithium niobate layer.

12. The acoustic wave device according to claim 11, wherein the piezoelectric layer includes tantalum niobate or lithium niobate with Euler angles ($\varphi$, $\theta$, $\psi^*$) in ranges defined in Expression (1), Expression (2), or Expression (3):

$$(0°\pm10°, 0° \text{ to } 20°, \text{any } \psi) \quad \text{Expression (1)}$$

$$(0°\pm10°, 20° \text{ to } 80°, 0° \text{ to } 60°(1-(\theta-50)^2/900)^{1/2}) \text{ or}$$
$$(0°\pm10°, 20° \text{ to } 80°, [180°-60°(1-(\theta-50)^2/900)^{1/2}] \text{ to } 180°) \quad \text{Expression (2)}$$

$$(0°\pm10°, [180°-30°(1-(\psi-90)^2/8100)^{1/2}] \text{ to } 180°, \text{any } \psi) \quad \text{Expression (3).}$$

13. A method for manufacturing the acoustic wave device according to claim 1, the method comprising:
providing the first IDT electrode on the first principal surface of the piezoelectric layer;
providing the second IDT electrode on the second principal surface of the piezoelectric layer at a location that does not overlap the first IDT electrode in plan view;
providing a multilayer body including the piezoelectric layer and the support substrate by bonding the piezoelectric layer and the support substrate together;
providing the insulating film on the second principal surface in the region overlapping the first IDT electrode in plan view; and
providing the wiring electrode such that the wiring electrode is connected to the second IDT electrode and extends along the insulating film in the region overlapping the first IDT electrode in plan view.

14. The method according to claim 13, wherein
in the providing the first IDT electrode, an extended wiring line is provided on the first principal surface of the piezoelectric layer such that the extended wiring line is connected to the first IDT electrode;
the step of providing the multilayer body includes providing a sacrificial layer on the first principal surface of the piezoelectric layer such that the sacrificial layer covers the first IDT electrode, providing an intermediate layer on the first principal surface such that the intermediate layer covers the sacrificial layer, and bonding the intermediate layer and the support substrate together; and
the method further comprises:
providing a plurality of through holes in the piezoelectric layer including a through hole extending to the sacrificial layer and a through hole extending to the extended wiring line;
providing a cavity by removing the sacrificial layer by using the through hole extending to the sacrificial layer; and
providing a connection electrode in the through hole extending to the extended wiring line such that the connection electrode is connected to the extended wiring line.

15. The method according to claim 13, wherein
the support includes a cavity in which the first IDT electrode is located;
the piezoelectric layer includes a through hole extending to the cavity; and
the acoustic wave device further comprises a connection electrode extending through the through hole and connected to the first IDT electrode.

16. The method according to claim 15, wherein
the support includes an intermediate layer between the support substrate and the piezoelectric layer; and
at least a portion of the cavity is provided in the intermediate layer.

17. The method according to claim 16, wherein
the cavity is a first cavity; and
at least a portion of a second cavity is provided in the intermediate layer in a region overlapping the second IDT electrode in plan view.

18. The method according to claim 13, wherein the insulating film has a Young's modulus of about 10 GPa or less.

19. The method according to claim 13, wherein the insulating film has a relative dielectric constant of less than about 5.

20. The method according to claim 13, wherein the insulating film is a resin film.

* * * * *